United States Patent [19]

Joshi et al.

[11] Patent Number: 4,712,215

[45] Date of Patent: Dec. 8, 1987

[54] CRC CALCULATION MACHINE FOR SEPARATE CALCULATION OF CHECKBITS FOR THE HEADER PACKET AND DATA PACKET

[75] Inventors: Sunil P. Joshi, Campbell; Venkatraman Iyer, Berkeley, both of Calif.

[73] Assignee: Advanced Micro Devices, Inc., Sunnyvale, Calif.

[21] Appl. No.: 803,367

[22] Filed: Dec. 2, 1985

[51] Int. Cl.$^4$ ............................................ G06F 11/10
[52] U.S. Cl. ..................................................... 371/37
[58] Field of Search .................... 371/37, 39, 40, 48, 371/53, 54; 364/200 MS File, 900 MS File

[56] References Cited

U.S. PATENT DOCUMENTS

| | | | |
|---|---|---|---|
| 3,872,430 | 3/1975 | Boudreau | 371/37 |
| 3,893,078 | 7/1975 | Finet | 371/37 |
| 4,282,551 | 8/1981 | Kanazawa | 371/38 X |
| 4,410,989 | 10/1983 | Berlekamp | 371/37 X |
| 4,450,561 | 5/1984 | Gotze | 371/37 |
| 4,498,174 | 2/1985 | Legresley | 371/37 |
| 4,593,393 | 6/1986 | Mead | 371/37 |

OTHER PUBLICATIONS

"(CRCC) Generating/Checking Logic", IBM TDB, vol. 28, No. 12, May 1986 pp. 5435–5436.
E. Loizides, "Check Character Generating Circuit", IBM TDB, vol. 5, No. 11, Apr. 1963, pp. 60-63.
Motorola Semiconductors, "CRCC Generator" Motorola Inc., 1973.

Primary Examiner—Jerry Smith
Assistant Examiner—Robert W. Beausoliel, Jr.
Attorney, Agent, or Firm—Patrick T. King; Ronald C. Fish; J. Vincent Tortolano

[57] ABSTRACT

There is disclosed herein a CRC calculation circuit which can calculate CRC checkbits on 8 bits of raw input data per cycle of a byte clock. The calculation apparatus used 8 rows of shifting links with the inputs of each row coupled to the data outputs of the preceding row. Each shifting link shifts its input bit one bit position toward the most significant bit, and selected shifting links perform an exclusive-OR operation between their input bits and the output of an input exclusive-OR gate which exclusive-OR's one input bit with one of the bits in the most significant byte of the checksum register. A byte wide output bus is used to access the final checkbits from the checksum register by disabling the array of shifting links during the output cycles so that the bytes of CRC data can be shifted into position through the array one byte per each cycle of the byte clock. Preset logic for forcing all logic 1's into the data inputs of the first row of shifting links is provided such the machine can be preset during the first clock cycle of the CRC calculation. Several different architectures are disclosed for allowing separate calculation of CRC bits on a header packet and a data packet where the CRC bits on the data packet may be calculated on the data alone or the data plus the header and the CRC bits for the header. Logic for allowing CRC calculation to be performed on all bytes of a message while excluding some selected number of bits in the first byte is also disclosed.

35 Claims, 25 Drawing Figures

CRC CALCULATION MACHINE FOR SEPARATE CALCULATION OF CHECKBITS FOR THE HEADER PACKET AND DATA PACKET

The invention pertains to the field of cyclical redundancy codes calculation circuits for detecting errors in transmission of serial data over communication links. More particularly, the invention pertains to certain improvements in CRC calculaton apparatus in integrated circuit form to conserve chip area.

Error detection and correction using codes and check bits has long been used to improve the reliability of data transfers between units on a network or units in a computer system such as disk or main memory and the central processing unit. The most common scheme is parity checking. In this scheme, parity check bits are added to the information bits to make the total number of bits which are logic 1's in a byte equal to a known number. However this scheme has the well known drawback that when the number of information bits becomes high, the level of redundancy in terms of check bits required becomes excessively high.

Another checking scheme exists called polynomial or cyclic coding. This scheme can be designed to perform with higher efficiencies, i.e., less redundancy, than the parity checking schemes. The high efficiency of these schemes is inducing designers to use them more and more frequently.

The general concepts of cyclic coding schemes are most easily understood through use of several mental aids. A convenient way of thinking of a bit stream of data in serial format consisting of K bits is to think of it as a polynomial in a dummy variable x with K terms. The bits of the message are the coefficients of the polynomial. Thus, if 100100011011 is the bit stream message, the polynomial may be written as:

$$M(x) = 1.x^{11} + 0.x^{10} + 0.x^9 + 1.x^8 + 0.x^7 + 0.x^6 + 0.x^5 + 1.x^4 + 1.x^3 + 0.x^2 + 1.x^1 + 1.x^0 \quad (1)$$

or $$M(x) = x^{11} + x^8 + x^4 + x^3 + x + 1$$

To compute the cyclic code check bits (hereafter CRC bits) on a message, another polynomial P(x) called a generating polynomial is chosen. The degree of this polynomial, i.e., its highest exponent value, is greater than zero but less than the degree of M(x). The generator polynomial has a non-zero coefficient in the $x^0$ term. For a message of a given length, more than one generating polynomial can be specified. Several accepted standard generating polynomials exist. A standard 32 bit generating polynomial is defined for the Autodin II and Ethernet® standard. This generating polynomial is found in the draft proposed American National Standard for FDDI Media Access Control X3T9.5/83-16 update of 6-01-84. This standard generator polynomial is:

$$P(x) = x^{32} + x^{26} + x^{23} + x^{22} + x^{16} + x^{12} + x^{11} + x^{10} + x^8 + x^7 + x^5 + x^4 + x^2 + x + 1 \quad (2)$$

Cyclic check or CRC bit computation involves dividing the message polynomial by the generator polynomial to generate a quotient polynomial and a remainder polynomial. The quotient polynomial is discarded and the remainder polynomial coefficients are appended to the message polynomial as CRC check bits.

The combined message and check bits are then transmitted over the communication link and arrive at the receiver either modified or unmodified depending upon whether errors occurred during the transmission. Generally, the receiving apparatus divides the complete received message, including check bits, by the same generator polynomial which was used to generate the check bits at the transmitter end of the link. The result of this division is a zero remainder polynomial if no error occurred during the transmission. A non-zero remainder indicates the presence of an error.

The type of apparatus that is used to perform the above described calculation on serial format input data is shown in FIG. 1. FIG. 1 is a block diagram of a CRC checkbit calculation machine. The CRC checksum register 30 is comprised of a plurality of memory cells that store the CRC check bits. The outputs of these memory cells are coupled to the inputs of an array 32 of shifting links some of which are exclusive-OR gates as best seen in FIG. 2.

FIG. 2 is a detailed circuit diagram of the block diagram of FIG. 1. The most significant output bit from the checksum register 30 is exclusive-ORed by an input gate 34 with the incoming serial data stream of the message polynomial, and the output of the exclusive-OR gate 34 which performs this function is coupled to an input of all the other exclusive-OR gates in the array. The array shifting links which are not exclusive-OR gates are simple conductors which merely shift the incoming data one bit position left or toward the most significant bit position. The outputs of the shifting links of the array are coupled back to the data inputs of the checksum register 30 by a bus 36. The exclusive-OR gates in the array 32 as well as the straight through conductors have their outputs coupled to the input of the checksum register of the next most significant bit position relative to the bit position of the input bits positions for each shifting link from the checksum register. A bit clock signal on the line 38 clocks the raw serial format input data of the message polynomial into the input gate 34 and causes the checksum register to load the data from the bus 36 into its memory cells. After all the raw input data bits in the message have been clocked in, the checksum register 30 contents are the CRC check bits for the message bits so processed.

FIG. 3 illustrates the format of the composite data packet that is transmitted after calculation of the checkbits. The segments 40 is the message polynomial upon which the CRC bits were calculated. These message polynomial bits are transmitted simultaneously with the calculation of the CRC bits in that each time a bit is input to the gate 34, it is simultaneously transmitted. The segment 42 is the complement of the CRC bits stored in the checksum register 30 after all the bits in the segment 40 have been processed. The segment 42 is comprised of complement CRC bits so that when CRC bits are calculated on the receiving end on the combined segments 40 and 42, the remainder will come out zero. In some protocols, the checksum register is preset to all logic 1's before the CRC calculation starts. In such a case, when CRC checkbits are calculated on the combined packet consisting of segments 40 and 42, the remainder will not be all zeros but will represent a standard remainder poynomial. This remainder polynomial will result every time when CRC checkbits are calculated on the combined segments 40 and 42 regardless of the bit pattern in the message polynomial 40.

The CRC checkbits in the segment 42 are sent following the segment 40 by switching a multiplexer 44 with a select signal on the line 47 to deselect the serial data input line 46 and select the output line 48 of an inverter 50. The input of the inverter 50 is coupled to the output of the most significant bit position memory cell in the checksum register. The inverter 50 inverts the check bits as they are clocked out in serial fashion by the bit clock signal on the line 38. The composite packet comprised of segment 40 followed by the CRC checkbits 42 appears on the serial output line 52.

A problem arises with the architecture of FIG. 1 where no bit clock signal in available to clock in raw input data to the input gate 34. Some systems are byte oriented and only provide a byte clock signal for every eight bits. Such systems must be able to compute CRC bits by accepting one byte of raw input data at a time and simultaneously computing the CRC bits taking into account the effect of each bit in the raw input data byte. An architecture to accomplish this parallel CRC computation is shown in FIGS. 4A and 4B.

In FIGS. 4A and 4B, the array of shifting links is comprised of a plurality of rows of shifting links with each row assigned to process one of the bits of the raw input data byte. The raw input data byte is shown as the bits D7 through D0 coupled to the input gates on the left. Each of these input data bits is coupled to an input of one of the input exclusive-OR gates 66, 68, 70, 72, 74, 76, 78 and 80. Each of these input gates has its output coupled to an input of each exclusive-OR gate in its row and to the input of the least significant bit position shifting link in the next row. Thus each row in the array 56 acts like the shifting links row 32 in FIG. 1 except that its outputs are connected to the inputs of the next row. The first row has its inputs coupled to the outputs of the checksum register 30 and the last row has its outputs coupled to the inputs of the checksum register. Each row has one input of its input gate coupled to the output of one of the bits in the highest order byte in the checksum register, the first row being connected to the highest order bit and the second row being connected to the second most significant bit and so on for all the rows. Each shifting link in each row shifts its input bit one bit position toward the most significant bit position of the checksum register. The architecture of FIGS. 4A and 4B therefore calculates CRC bits by processing 8 bits of raw input data at a time.

If the architecture of FIGS. 4A and 4B is to be integrated, several improvements can be made which save chip area and which enable the architecture to perform several functions which cannot be done with the architecture of FIG. 1. For example, to get the CRC bits out of the checksum register 30 in parallel format in the architecture of FIG. 1 or FIGS. 4A and 4B requires that a conductor be connected to each output of the checksum register 30. For a 32 bit checksum register, this would require that a great deal of chip area be consumed by the output bus conductors. It would be useful if only the highest order byte of CRC outputs were connected to the output bus and the other bytes of CRC data were shifted into the highest order byte for output. This would cut down the number of conductors in the output bus from 32 to 8 thereby saving much chip area.

In some systems it is necessary to calculate a first set of CRC bits on a first data packet and a second set of CRC bits on a second data packet either immediately following the first data packet or immediately following transmission of the CRC checkbits calculated on the first data packet. It is customary in many CRC calculation machines to preset the contents of the checksum register to all logic 1's just before the start of the CRC calculation. This improves the performance of the CRC calculation machine in that input data strings having long strings of logic 0's will still affect the contents of the checksum register such that if there is a malfunction in the checksum register or the calculation array, the malfunction can be immediately detected. If the checksum register were not preset to all 1's, a defect in the checksum register or calculation array might not be detected in such a circumstance.

When separate CRC check bits are to be calculated on two back to back packets, there is no clock cycle between the first and second packets during which the checksum register can be preset by inputting all logic 1's into the memory cells. It would be useful to provide a way to preset the CRC calculation machine for the second data packet in such a situation where there is no spare clock cycle between the first packet and the second packet.

It is common in networks of computers to formulate data packets which have header bits which define the network and the particular node of that network to which is addressed a data message appended to the header bits. It is desirable in such situations to be able to calculate the CRC bits in either of two ways. The first way is to calculate a header CRC on the header bits, and then to calculate a data CRC on the data message. The second way is to calculate a header CRC on the header bits, and then to calculate a data CRC on the whole packet including the header bits, the header CRC check bits and the data message. It would be useful to provide a CRC calculation machine which could calculate CRC checkbits using either of these two methods.

In the token ring computer network environment where all nodes in the network are connected together in a ring by a single cable, it is common to have multibyte messages being sent along the network where the first byte has certain initial bits which can be changed on the fly by any node in the network. It is not desirable to include these initial bits which are subject to unpredictable changes which are not errors in the CRC calculation. Such changes would show up in the CRC check bits as errors if a change in one of these bits occurred while passing through a node between the transmitting and the receiving node. It would be useful to provide a CRC calculation machine which could calculate the CRC on a data packet using only a byte clock and still be able to exclude from the CRC calculation any number of initial bits in the first byte of a message.

The invention fills the need for a CRC calculation machine which can calculate CRC checkbits on both the header packet and the data packet separately where the CRC checkbits for the data packet are calculated either on the data packet alone or on the data packet plus the header packet plus the CRC bits for the header packet. The invention is comprised of a checksum register and an array of shifting links. In the preferred embodiment the array of shifting links is a plurality of rows, one row for each bit of each input byte. The clock inputs of the checksum register memory cells are coupled to a byte clock signal which causes loading of data at the inputs of the checksum register periodically. The inputs of the checksum register are coupled to the outputs of the last row of the array of shifting links through an input multiplexer. The outputs of the checksum register are coupled to the data inputs of the first row of shifting links. Each row has one column or shifting link position for each bit in the checksum register. Some of the shifting links are exclusive-OR gates which have one input coupled to the output of an input gate. The other input of each exclusive-OR gate shifting link is coupled to an output bit of the checksum register for the column of that particular gate. The input gate for each row has one input coupled to one bit of the raw input data and one input coupled to one output of the checksum register in the most significant byte. The input gate for the first row in the array has one input coupled to the raw input data bit which would arrive first if the data were input in serial format. Another input of the input gate of the first row is coupled to the output of the most significant bit position memory cell in the checksum register. The second row input gate has one input coupled to the raw input data bit which would arrive second if the data were input in serial format. Another input of the input gate of the second row is coupled to the output of the second most significant bit position memory cell in the checksum register. This pattern is repeated for each row in the array. Each input gate performs an exclusive-OR function between one bit of the raw input data byte and one bit of the most significant byte of data stored in the checksum register.

The output of each exclusive-OR gate shifting link is coupled to the input of the shifting link in the next row in the next most significant bit position. The shifting links which are not exclusive-OR gates are conductors which conduct the bit at their inputs to the input of the shifting link in the next row in the next most significant bit position, i.e., they perform a simple one bit shift function and nothing more.

The preferred embodiment uses an input multiplexer having its output coupled to the data inputs of the checksum register and having three inputs. One input is coupled to the outputs of the shifting links in the last row of the array. Another input is coupled to the data outputs of the checksum register. A third input is coupled to a predetermined bit pattern. This bit pattern represents the CRC checkbit pattern which results when a CRC calculation is performed on any data packet plus the CRC checkbits previously calculated on that data packet starting from a checksum register which has been preset to all logic ones. The input multiplexer has control inputs for receiving signals which control which of the inputs is selected at any particular time for coupling to the output of the multiplexer. By suitably manipulating the control inputs of the multiplexer, the machine may be caused to calculate CRC bits on the header and data packets standing alone or may be forced to calculate the CRC bits on the data packet plus the header and the header CRC bits. To do this latter function, the input of the input multiplexer connected to the remainder bit pattern is selected at a time after the CRC bits on the header have been calculated and these CRC bits have been shifted out and just before the first clock cycle of the interval where the data packet is input to the array.

In other embodiments, a snapshot register is coupled between the outputs of the last row of the array and the data input of the multiplexer normally coupled to the data outputs of the last row of the array. The snapshot register is clocked to make a copy of the CRC bits calculated on the header after they have been calculated. Depending upon the desired method for calculation of the CRC bits on the data packet, the CRC bits for the header are then either output or multiplexed back into the data inputs of the array through a multiplexer which channels either raw input data or data from the snapshot register into the data inputs of the array.

In any of the above embodiments, the array may be a single row of shifting links. The raw input data is then input one bit at a time in serial fashion.

These and other aspects of the invention will be better understood from study of the following detailed description of the invention and the attached drawings of which there follows a brief description.

Byte Wide Output Bus

Figure 5:
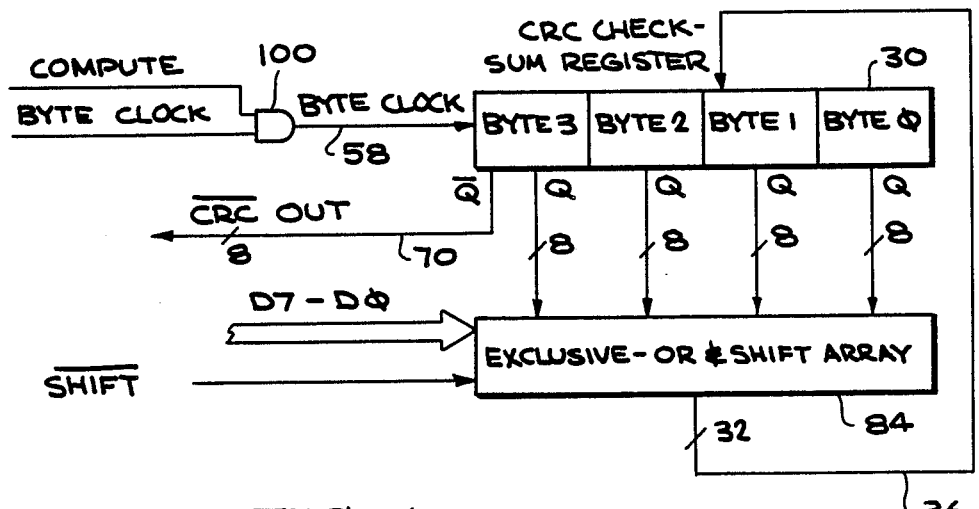
FIG. 5 is a block diagram of the preferred embodiment of a CRC calculation machine using a single byte wide output bus for outputting the CRC bytes.
Figure 7A:
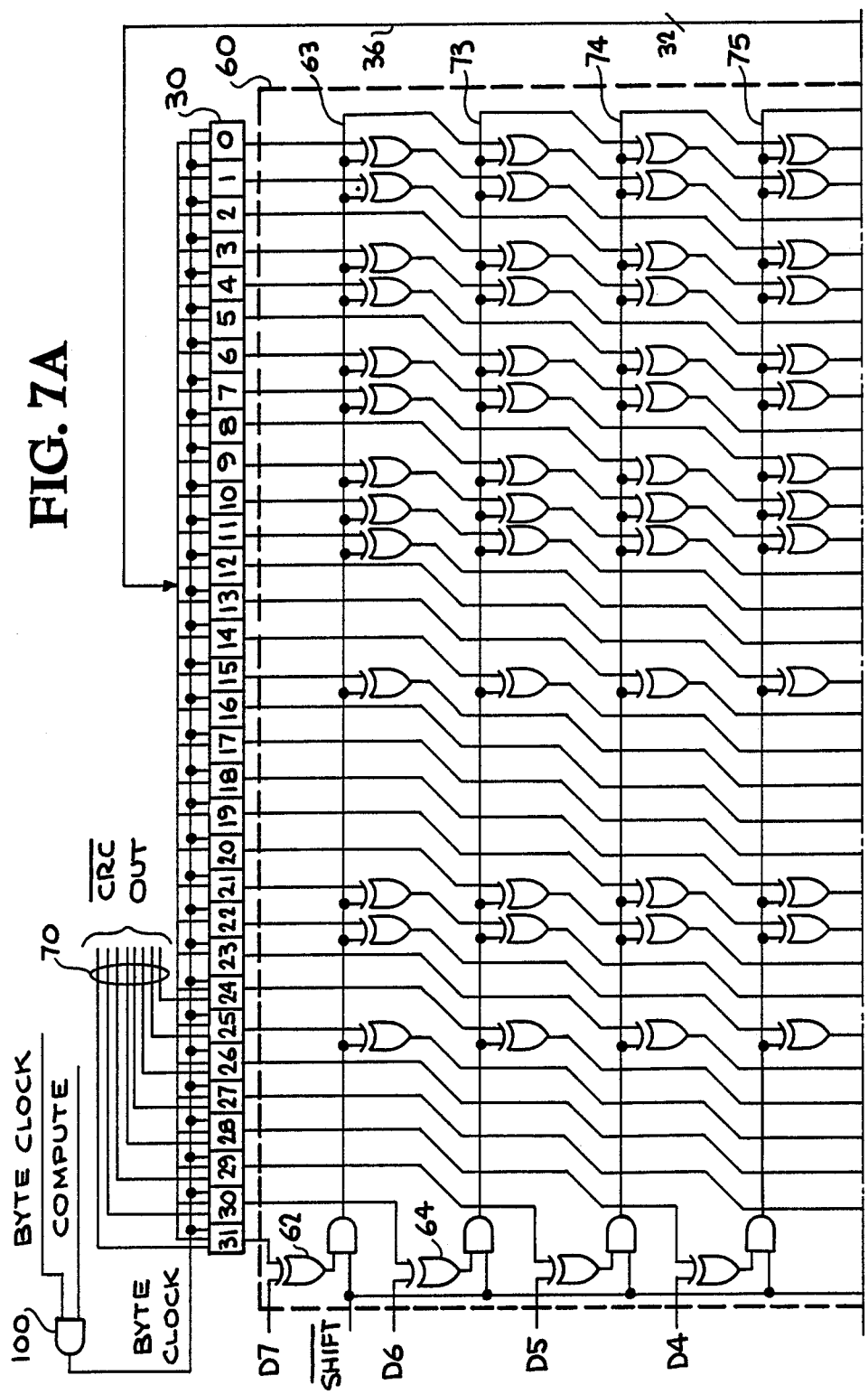
FIGS. 7A and 7B is a logic diagram of the logic of the embodiment of FIG. 5 showing the AND gates used in the array of shifting links to cause the shifting of lower order CRC bytes into the most significant byte position for output.
Figure 7B:
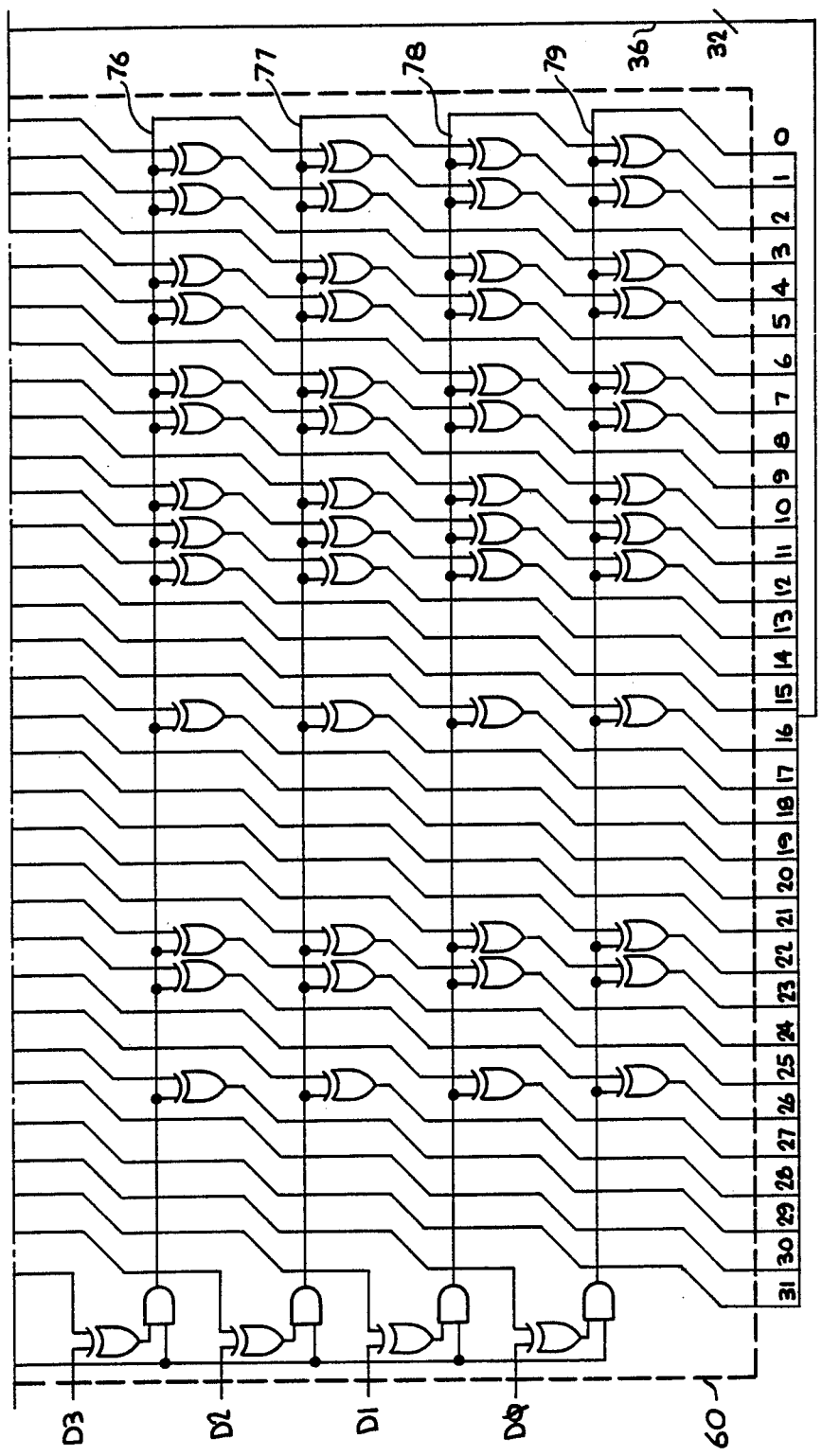

Turning to FIG. 5 and FIGS. 7A and 7B there are shown, respectively, block diagrams and logic diagrams of he preferred embodiment of a CRC machine for calculating multiple CRC bytes and outputting them over a single byte wide output bus. The embodiment of FIG. 5 employs and checksum register 30 comprised of a plurality of memory cells, each having a data input, a data output and a clock input for receiving a byte clock signal. Upon receipt of the byte clock signal, any data on the inputs of the memory cells will be latched into the cell and reflected on the data outputs of the cells. Each memory cell operates independently of the adjacent cells on its left and right. The checksum register is segmented logically into a plurality of bytes of CRC data designated bytes 0 through 3 in FIG. 5. In the preferred embodiment, there are 8 bits per byte and 32 bits total in the checksum register with byte 3 being the most significant byte. In FIG. 5, byte 3 is comprised of memory cells 24 through 31.

The data outputs of the checksum register are coupled to the inputs of an array of shifting links 60 as shown in 7A and 7B. This array of shifting links is comprised of one row of shifting links for each bit of a raw input data byte comprised of the data bits D0 through D7 which enter the array on the left. These raw input data bits are the data bits of the message upon which a CRC calculation is desired. Each raw input data bit is coupled to one input of an input gate. There is one input gate designated for each row with a designated raw input data bit designated for that row and that input gate. For the first row, the designated raw input data bit is D7 and the designated input gate is the exclusive-OR gate 62. For the second row, the designated raw input data bit is D6, and the designated input gate is the exclusive-OR gate 64. A similar situation exists for each row and for all the bits of the raw input data byte. If the data bits were arriving in serial format, most significant bit first (an arbitrary assumption) and D7 was designated the most significant bit (another arbitrary assumption), then the designated raw input data bit for the first row would be the most significant bit of each bit or the first arriving bit if the bits were arriving serially. The designated bit for the second row would be the second most significant bit or the second bit to arrive if the bits were arriving in serial format. The third row would have as its designated bit, the third most significant bit or the bit arriving third in time and so on for all the rows.

Each input gate has another input coupled to one of the data outputs of one of the bits of the most significant CRC byte. The input gate for the first row, gate 62 has its other input coupled to the data output of the most significant CRC bit, bit 31. The input gate for the second row has its other input coupled to the second most significant CRC bit, bit 30 and so on for all the rows.

Each row of shifting links is comprised of a plurality of straight through conductors which do nothing but shift the bits at their inputs to their outputs which are connected to the inputs of the next row of shifting links in the next most significant bit position. That is these straight through conductors do nothing but shift their input bits one bit position left. The balance of the shifting links in each row are exclusive-OR gates which have one input as a bit input for the CRC bits for the checksum register or from the preceding row and which have another input coupled to the output of the input gate designated for that row. This latter input is not coupled directly to the output of the input gate, but is coupled to the output of an AND gate designated for the particular row. On input of this AND gate is coupled to the output of the exclusive-OR gate and another input is for receipt of a SHIFT not signal the purpose of which will be explained below. The output of the AND gate for each row is also coupled to the input of the least significant shifting link of the next row. There is one designated AND gate for each row.

The output of each exclusive-OR gate shifting link is coupled to the input of the next most significant bit position shifting link in the next row, i.e., each exclusive-OR gate shifts its input bit one bit position to the left after performing the exclusive-OR operation on it.

The relative positions of the exclusive-OR gate shifting links depends upon the particular generator polynomial being used. For the Autodin II and Ethernet standard generator polynomial given in formula (2) above, the exclusive-OR gates must be located so as to have their inputs coupled to bits 0, 1, 3, 4, 6, 7, 9, 10, 11, 15, 21, 22, 25 and 31 of the checksum register 30. The reason for this is well known to those skilled in the art of CRC calculation and will not be explained here for brevity and simplicity. Each row has its exclusive-OR gates in the same bit position. The inputs of the first row are coupled to the outputs of the checksum register as if it were a preceding row, and the outputs of the last row are coupled to the inputs of the checksum register as if it were the next row.

The data outputs of the most significant byte of the CRC register are also coupled to the individual conductors of the CRC output bus 70. Preferably, each memory cell will have a complement output, and it is these outputs of the most sigificant byte which are coupled to the output bus 70. Alternatively, an inverter can be used in each line to invert the CRC bits prior to transmission.

The purpose of the AND gates and the SHIFT* (SHIFT* and any other signal with an * means "active low") signal is to allow the array of shifting links to be made transparent so that data at the output of the checksum register will pass through the array unchanged and be shifted left by one byte in the process and re-input into the checksum register. When the SHIFT not signal is asserted, i.e. logic 0, all the AND gates such as the gates 66 and 68 have logic 0 outputs. The logic 0's on the lines 63 and 73 through 79 renders the exclusive-OR gates in the rows of shifting links transparent such that they pass their input data from the preceding row through to their outputs coupled to the next row without change. Because each row shifts its input data one bit to the left, and because there are 8 rows, the result is that for every cycle of the byte clock signal the data in the checksum register is shifted left by one byte when the SHIFT* signal is asserted. This allows all bytes of the CRC data to be accessed through the single byte wide output bus 70.

The embodiment of FIG. 5 may also be used in a serial format with some modifications. If the array of shifting links 84 is a single row of shifting links, then the AND gates of FIGS. 7A and 7B will not work to cause single byte left shifts for every byte clock signal. In a serial data input environment, the raw data input to the array 84 would be one bit at a time in serial format in synchronization with a bit clock signal. After all the raw input data bits are processed, the CRC checkbits for the message would reside in the checksum register 30. The most significant byte could be read immediately on the output bus 70. The remaining bytes would be shifted left one bit at a time by an additional coupling of each CRC bit data output to the input of the next most significant CRC bit input, i.e., the input of the neighboring cell on the left. This coupling would be through a multiplexer for each bit which would have one input coupled to the bus 36 and the other input coupled to the CRC bit data output on the right. The output of the multiplexer would be connected to the data input of the left neighbor. When outputting CRC bytes 2, 1 and 0, these multiplexers would be set to select the inputs coupled to the right neighbor of each cell. An additional logic circuit would then disable the output bus 70 for 8 cycles of the bit clock signal connected to the clock input of each cell in the checksum register and enable it when byte 2 had been shifted into the byte 3 or most significant byte position. The same process would be performed for each byte until all bytes had been read out.

Figure 6:
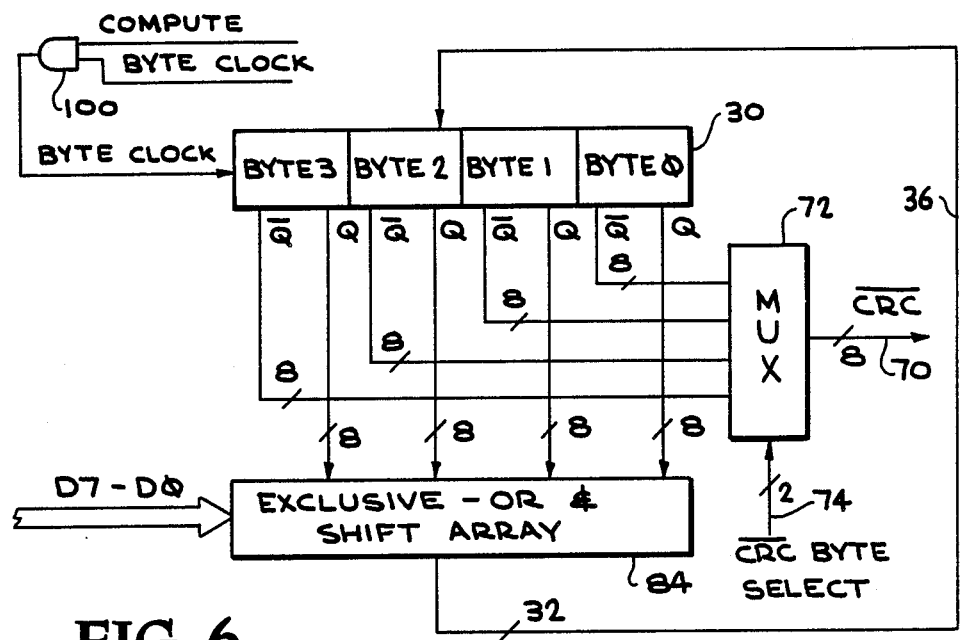
FIG. 6 is a block diagram of another embodiment of a CRC calculation machine using a single byte wide output bus connected to each byte of CRC data through a multiplexer.

Referring to FIG. 6 there is shown another embodiment for an output bus structure for a CRC calculation machine. This embodiment uses a multiplexer having 4 inputs each of which is coupled by a byte wide bus to the complement data outputs of one group of memory cells storing one byte of CRC data. A CRC not byte select signal on a bus 74 selects which of the four inputs to couple to the 8 bit output bus 70. CRC calculation is performed as described above, and it does not matter with respect to outputting the CRC data whether the array of shifting links 84 is a serial array or a parallel array or whether a bit clock or byte clock signal is used to clock the data in except the type of array and clock signal must be consistent.

Preset Embodiments

Figure 1:
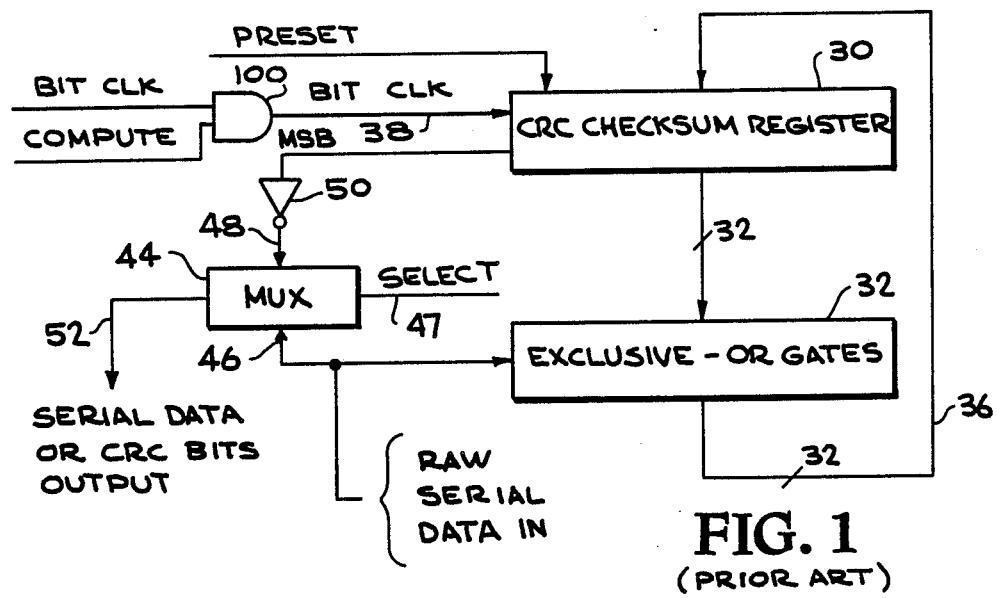
FIG. 1 is a block diagram of a serial format CRC calculation machine using a bit clock.
Figure 3:
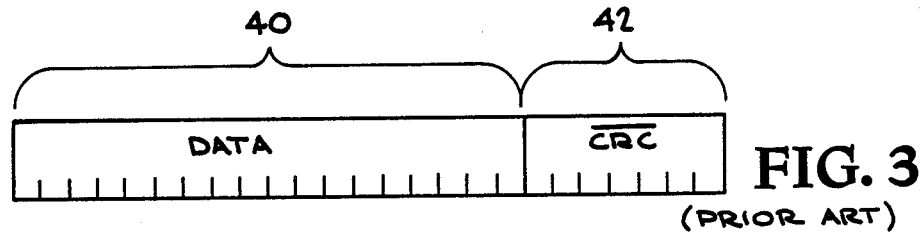
FIG. 3 is a diagram of the data format for a typical data message with its CRC bits appended.
Figure 2:
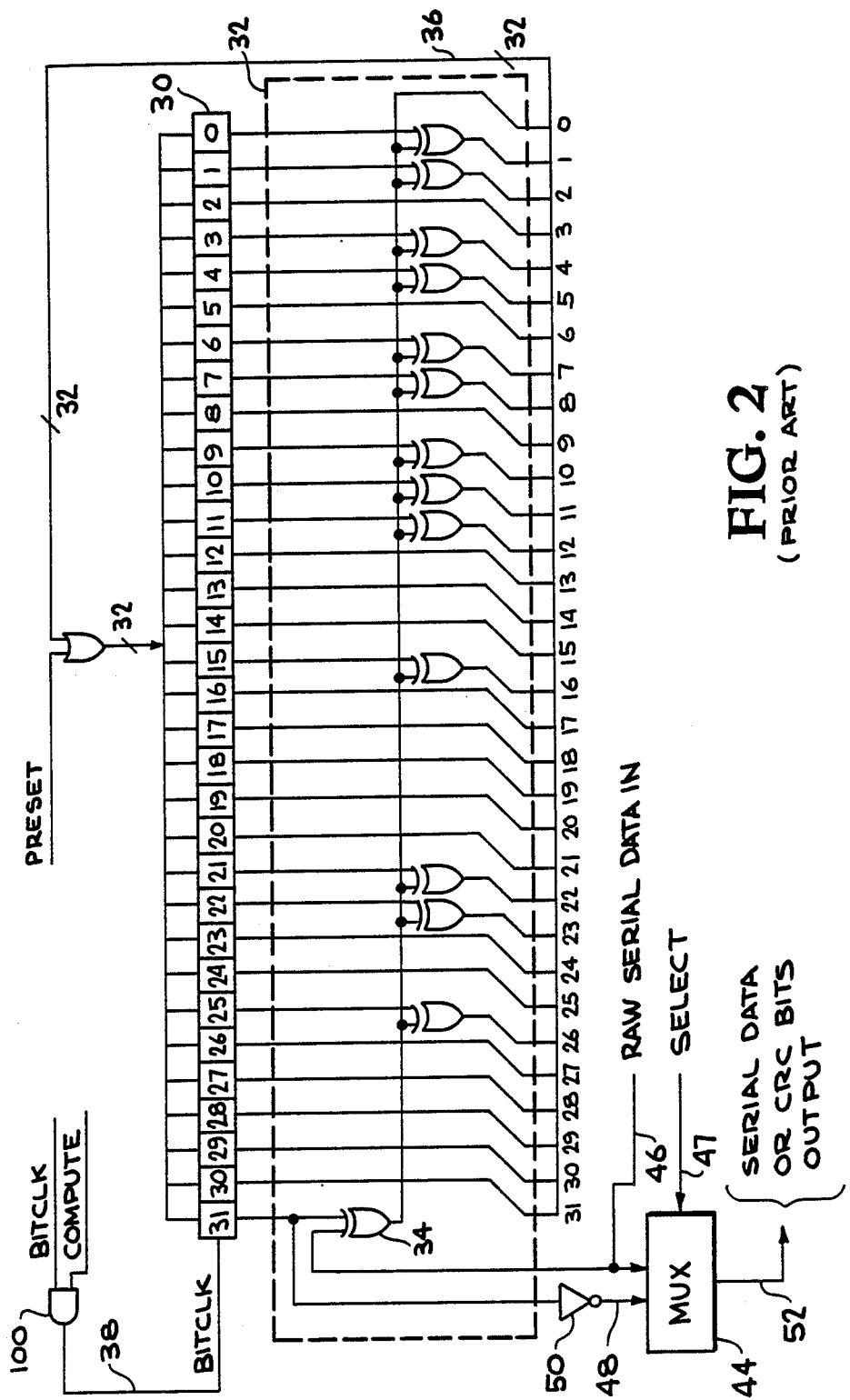
FIG. 2 is a logic diagram for the machine of FIG. 1.
Figure 4A:
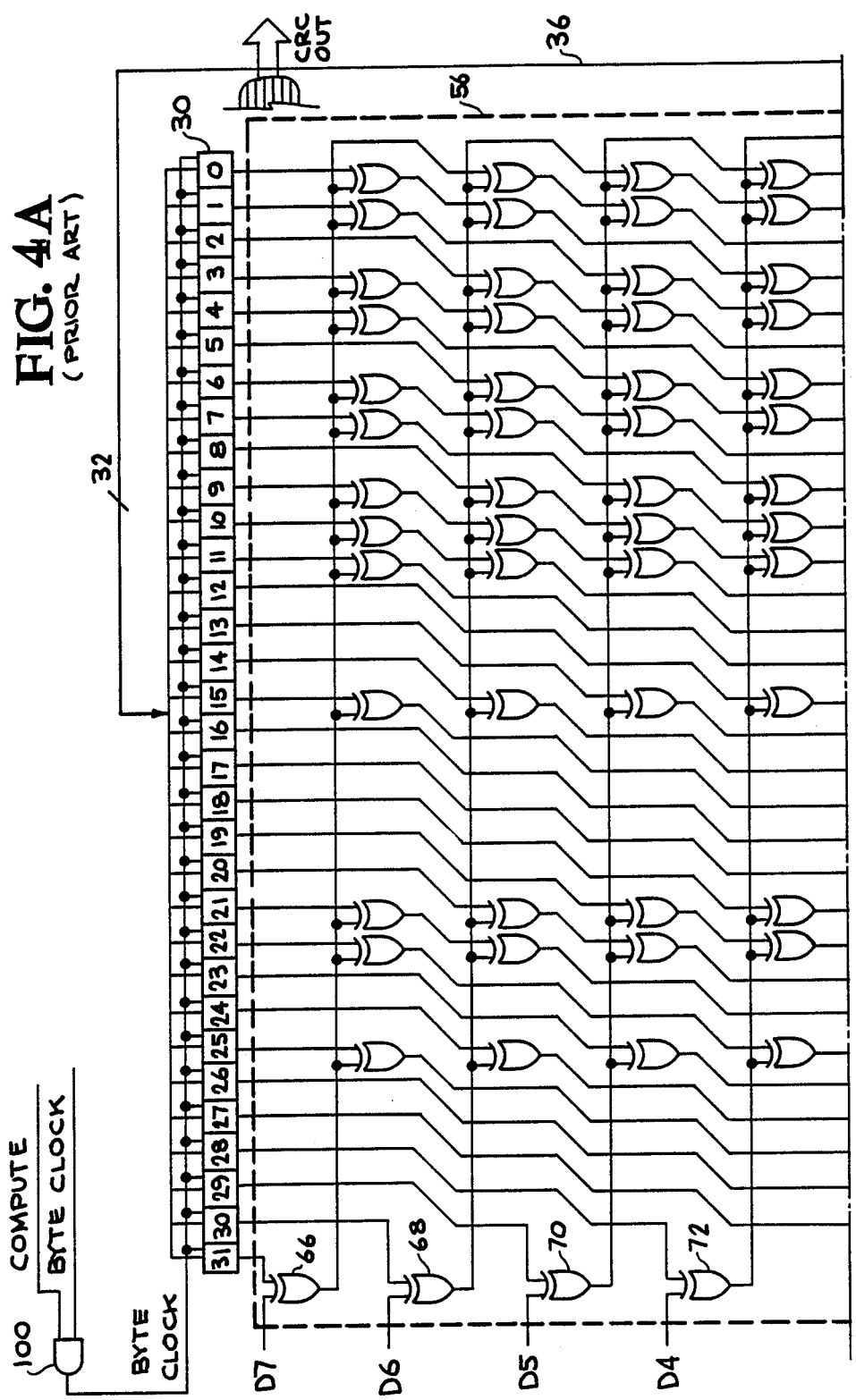
FIGS. 4A and 4B are a logic diagram for a parallel format CRC machine using a byte clock.
Figure 4B:
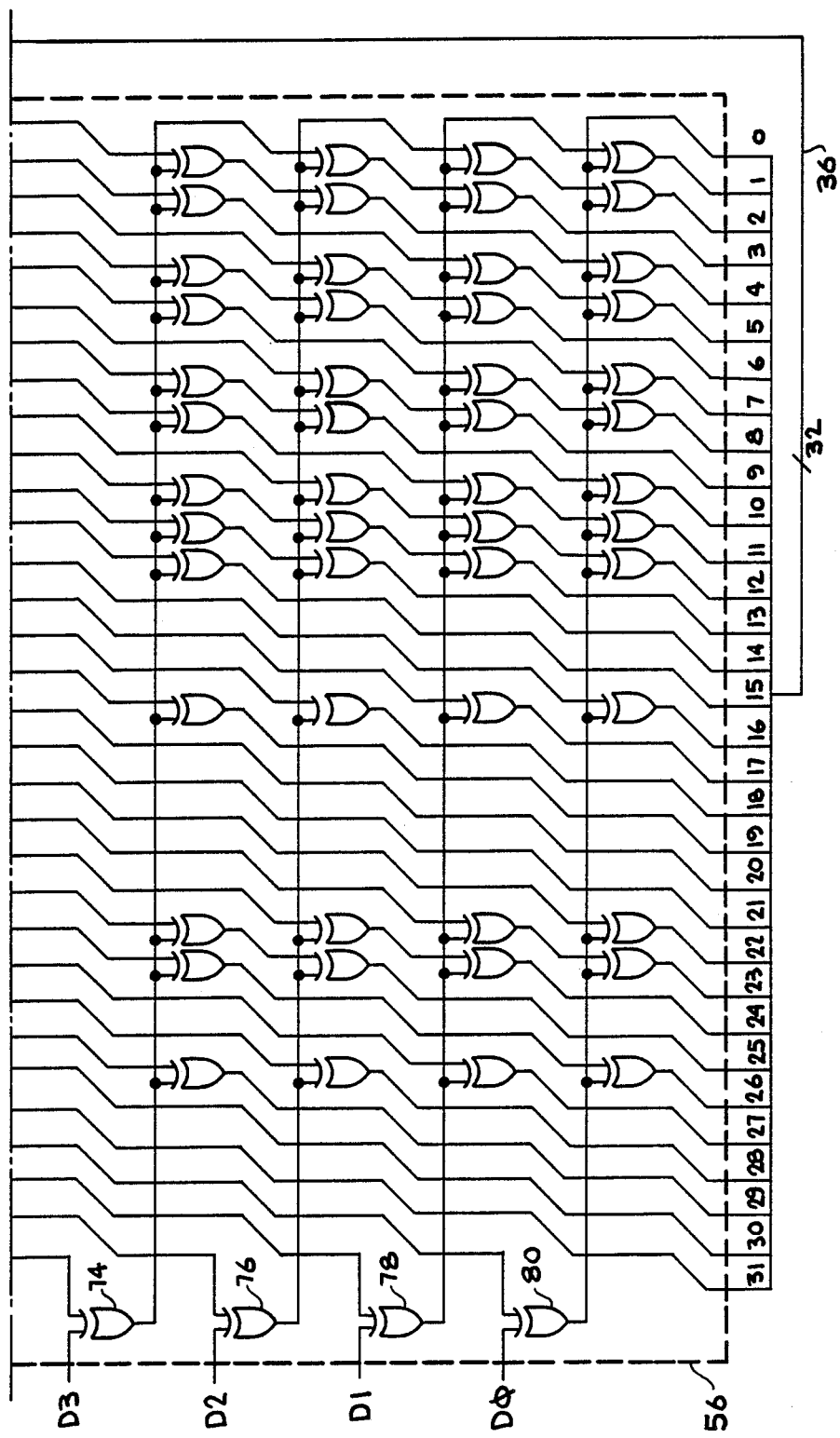
Figure 8:
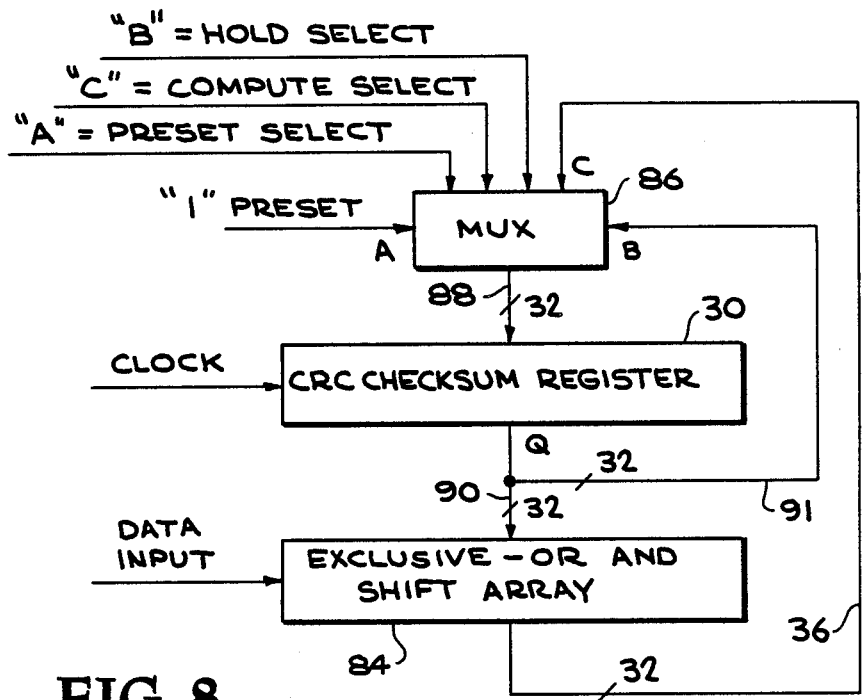
FIG. 8 is a block diagram of an embodiment of the invention for presetting the checksum register with all 1's using an input multiplexer and presetting in the clock cycle before the first clock cycle of the CRC calculation.

As mentioned above, it is accepted practice to preset the checksum register to all logic 1's before the start of the calculation of CRC checkbits. FIGS. 8 through 12 illustrate various embodiments for performing the preset function in two different ways and in both the serial and parallel calculation environment. FIG. 8 shows an embodiment of a CRC calculation machine using preset apparatus which must be actuated at least one clock cycle before the first clock cycle of the CRC calculation. The CRC apparatus is comprised of a checksum register 30 having its data outputs coupled to the data inputs of an exclusive-OR and shift array 84 as in the embodiments described above. The array 84 can be serial as the array 32 of FIGS. 1 and 2 or it can be parallel as is the array 60 of FIGS. 4A and 4B or 7A and 7B. In fact any of these arrays will suffice for purposes of practicing this aspect of the invention as will any other array of shifting links described hereafter. As in the above described embodiments, the last row in the array is coupled through a multiplexer 86 to the data inputs of the checksum register 30 by a data bus 36 which is 32 bits wide.

The mulitplexer 86 has three 32 bit wide inputs marked A, B and C, and a 32 bit wide output bus 88 which is coupled to the data inputs of said checksum register. The multiplexer has three select inputs for receiving input select signals. The particular select signal which is active at any particular time causes its corresponding one of inputs A through C to be coupled to the output bus 88. The A input is 32 logic 1's, and the B input is the 32 data outputs of the checksum register collectively referred to as bus 91. The C input is the 32 bit bus 36 carrying the data outputs from the last row in the array 84.

The input select signal PRESET SELECT is activated one or more clock cycles before the first clock cycle of the CRC calculation. This causes 32 logic 1's from input bus A to be coupled to the the bus 88 and loaded into the cells of the checksum register 30. Next, the COMPUTE SELECT input is asserted to couple the C input or bus 36 to the bus 88. While this condition exists, CRC calculation will proceed as the data of the message for which check bits are to be generated is clocked into the array 84. If at any time it is desired to stop the CRC calculation, the HOLD SELECT input may be asserted thereby connecting the outputs of the checksum register back into the inputs via the buses 90 and 88.

FIGS. 9 through 12 illustrate various embodiments of a CRC calculation machine where the preset apparatus allows the preset logic 1's to be loaded during the first clock cycle of the CRC calculation. Each of these embodiments, and all the other embodiments described herein which do not use a feedback bus such as the bus 130 in FIG. 17, employs an AND gate 100 in the clock line. These AND gates perform a logical AND operation between the clock signal and a COMPUTE signal which is asserted as a logic 1 when it is desired to compute CRC checkbits. When COMPUTE is a logic 1, CRC calculation can proceed. When COMPUTE is a logic zero, no CRC computation occurs, and the contents of the checksum register are constant.

Figure 9:
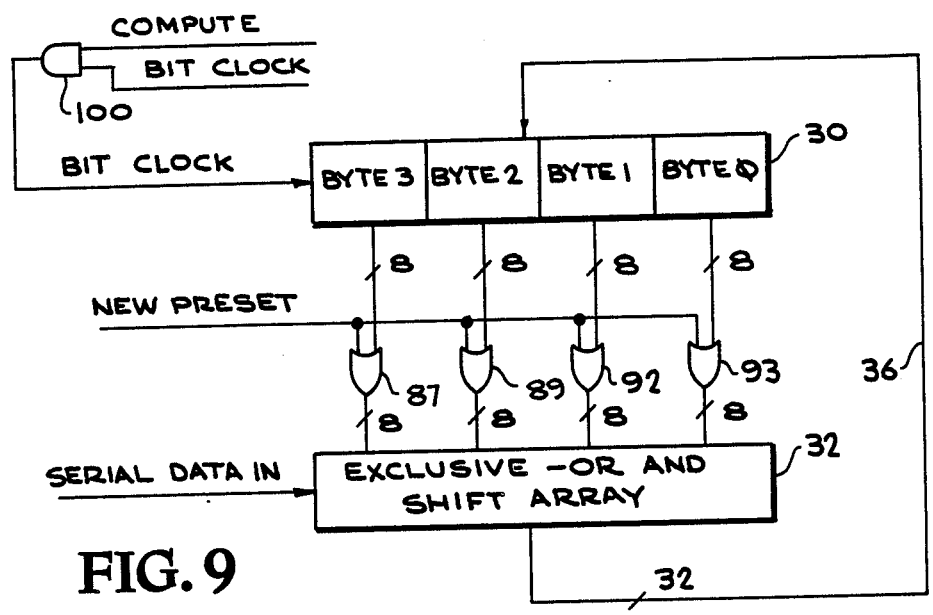
FIG. 9 is a block diagram of a serial input data format embodiment of the invention for presetting the checksum register with all 1's using OR gates and presetting in the first clock cycle of the CRC calculation.
Figure 10:
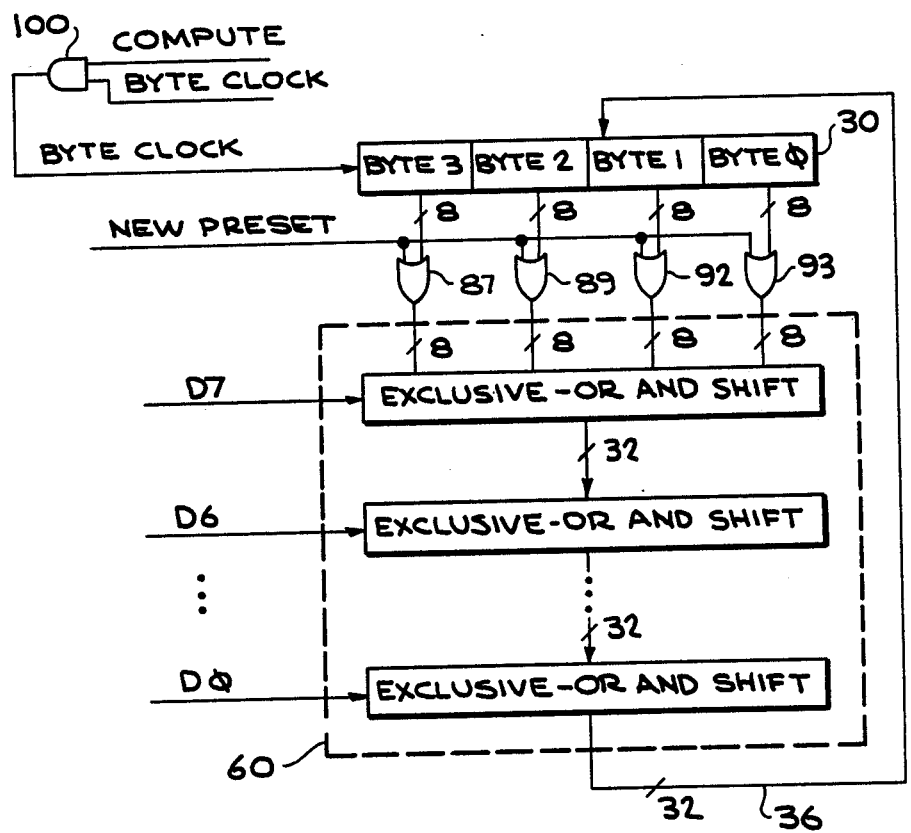
FIG. 10 is a block diagram of a parallel input data format embodiment of the invention for presetting the checksum register with all 1's using OR gates and presetting in the first clock cycle of the CRC calculation.
Figure 11:
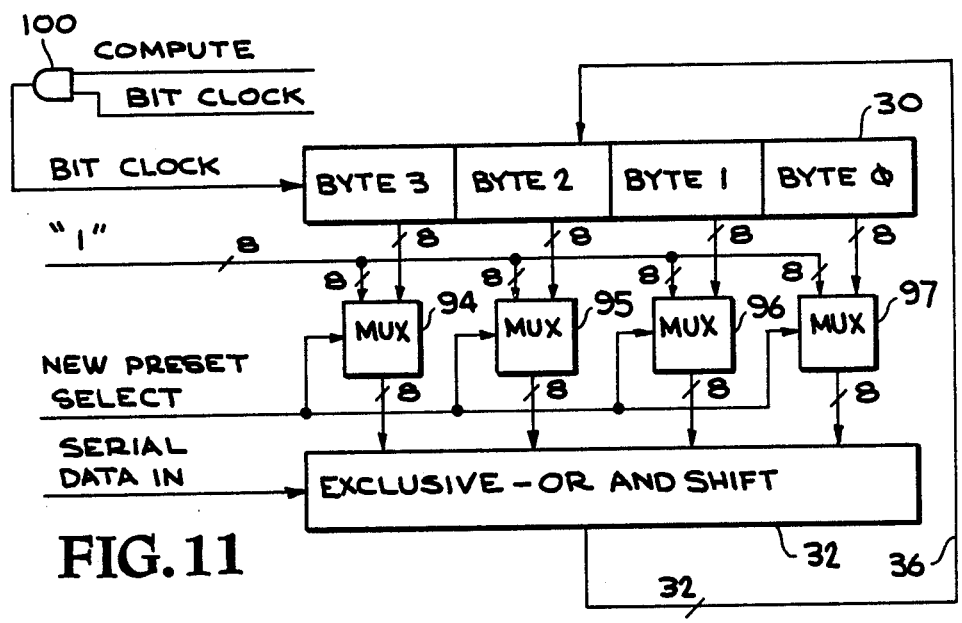
FIG. 11 is a block diagram of a serial input data format embodiment of the invention for presetting the checksum register with all 1's using multiplexers and presetting in the first clock cycle of the CRC calculation.
Figure 12:
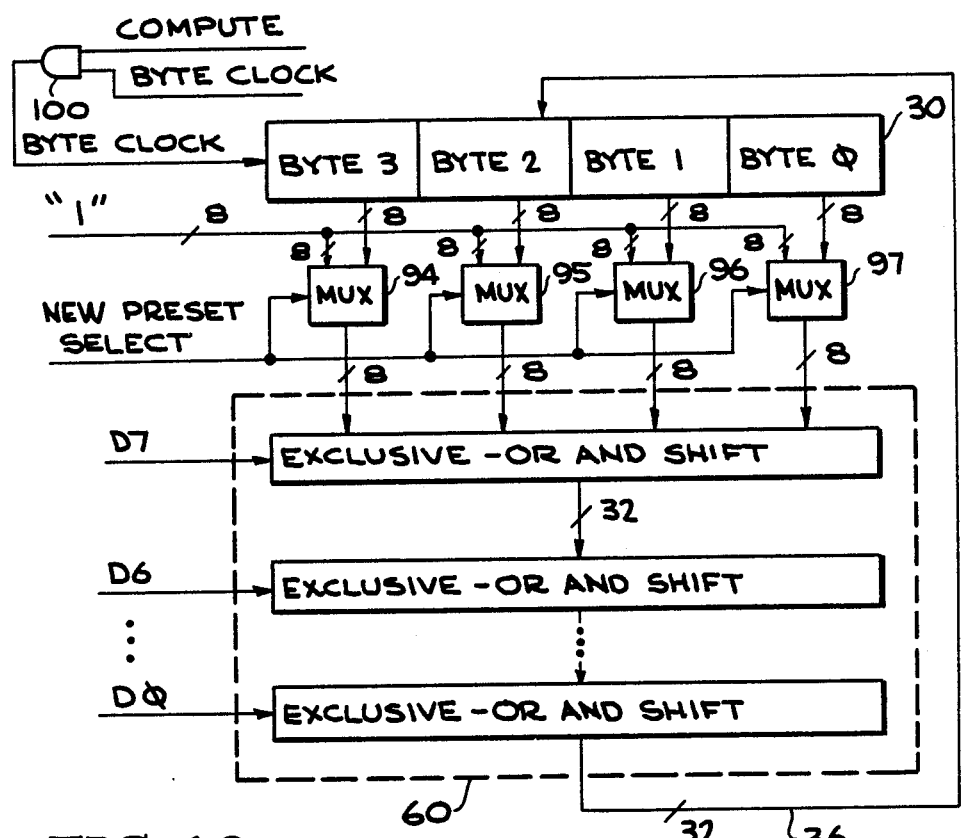
FIG. 12 is a block diagram of a parallel input data format embodiment of the invention for presetting the checksum register with all 1's using multiplexers and presetting in the first clock cycle of the CRC calculation.

FIGS. 9 and 10 show serial array and parallel array embodiments respectively using OR gates to implement the preset function. FIGS. 11 and 12 show serial and parallel array embodiments respectively using multiplexers to implement the preset function. Of these embodiments, FIG. 10 is the preferred embodiment. All of these embodiments will be discussed simultaneously as to the preset apparatus since the elements and the operation of the various elements and the form of the CRC calculation is the same for all the embodiments. These elements operate in the same manner as in the serial and parallel array embodiments of other aspects of the invention discussed above. Further, the arrays themselves can be any of the serial or parallel arrays described herein for purposes of practicing the aspects of the invention regarding preset during the first clock cycle of the CRC calculation without adversely affecting operation of this aspect of the invention.

An important element in each of the embodiments of FIGS. 9 through 12 is the coupling of the data outputs of the checksum register to the data inputs of the array of shifting links through circuitry which forces all the data inputs of the array of shifting links to a logic one state during the same clock cycle that the CRC calculation starts. The embodiments of FIGS. 9 and 10 use OR gates to implement this function of forcing logic 1's at the desired time while the embodiments of FIGS. 11 and 12 use multiplexers. In FIGS. 9 and 10 each of the four OR gates 87, 89, 92 and 93 represents 8 OR gates, and each performs an OR logic function on the bits of one of the bytes of CRC data stored in the checksum register 30. Each of the 8 OR gates represented by each of the gates 87, 89, 92 and 93 has an input coupled to one of the data outputs of a memory cell in the particular group of cells in the checksum register coupled to the corresponding OR gate 87, 89, 92 and 93. The output of each OR gate is coupled to an input of one of the shifting links in the first row of the array. Each OR gate has another input coupled to a NEW PRESET signal. When this signal is asserted as a logic 1, all the outputs of the OR gates assume a logic 1 value thereby forcing logic 1's at the inputs of the array of shifting links during the first clock cycle of the CRC calculation. This situation is equivalent to the situation which would exist if the checksum register 30 had been loaded with logic 1's on a previous clock cycle and those logic 1's were transmittted to the inputs of the first row of the array of shifting links on the first clock cycle of the CRC calculation.

After the first clock cycle of the CRC calculation, the NEW PRESET signal reverts back to the logic 0 state thereby rendering the OR gates transparent. Thereafter any data in the checksum register is transmitted through the OR gates 90 through 93 without change, and the CRC calculation proceeds normally.

FIGS. 11 and 12 accomplish the same forcing of logic 1's into the inputs of the first row of the array of shifting links using multiplexers 94 through 97 to redirect the inputs of the first row of shifting links in the array 32 or 60 to a source of 32 logic 1's. The multiplexers 94 through 97 could be represented as one multiplexer having two 32 bit inputs. One input would be connected to each of the 32 data outputs of the cells in the checksum register 30, and the other input would be for coupling to a source of 32 logic 1's such as a voltage source coupled to each of the conductors of the input. The output of the multiplexer would be a 32 bit bus coupled to the data inputs of the first row of shifting links in the array. The multiplexer would have an input for receiving a NEW PRESET SELECT signal. This signal is asserted during the first clock cycle of the CRC calculation and causes the multiplexer to select the input coupled to the source of logic 1's and to couple these logic 1's to the inputs of the first row of shifting links in the array. After the first clock cycle of the CRC calculation, the NEW PRESET SELECT signal reverts back to the state wherein the multiplexer couples the data outputs of the checksum register 30 to the data inputs of the array. Thereafter CRC calculation proceeds normally.

Figure 13:
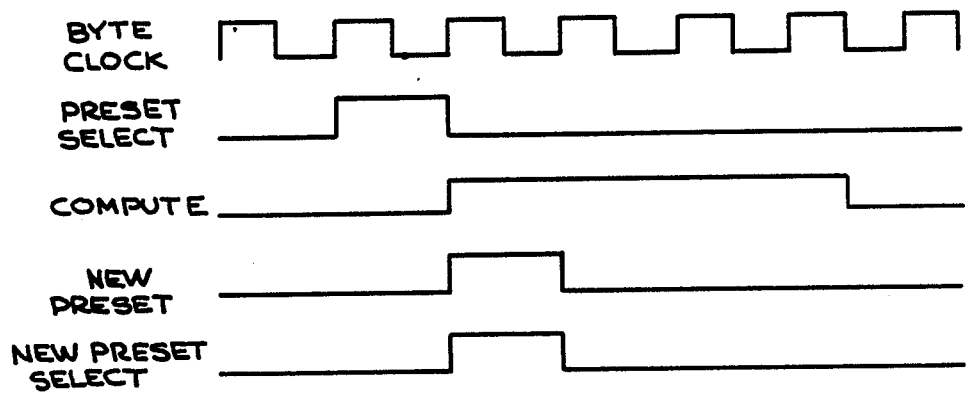
FIG. 13 is a timing diagram of the control signals which control the preset function in the embodiments of FIGS. 8 through 12 in either the serial or parallel format input data format and in either the embodiments where the presetting is done in the clock cycle preceding the first clock cycle of the CRC calculation or during the first clock cycle of the CRC calculation.

FIG. 13 shows a timing diagram showing the relationships of the clock signal and all the control signals of the embodiments of FIGS. 8 through 12. This diagram is self explanatory given the above discussion of the relationships of the preset signals to the first clock cycle of the CRC calculation.

Header CRC Calculation

Figure 14A:
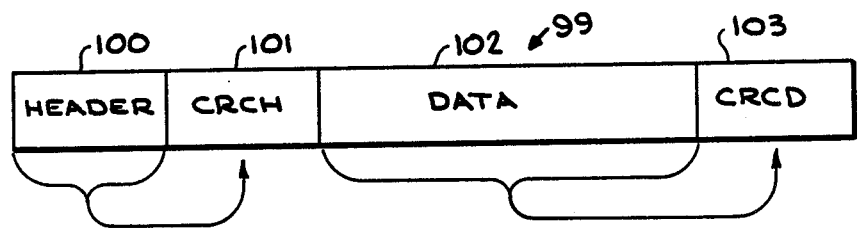
FIGS. 14A and 14B illustrate the data packet format of a typical network message and illustrates two different methods of calculating CRCH checkbits on the header and CRCD checkbits on the entire message or on the data packet alone.

In many applications for transmission of serial data, header packets are used. These headers packets are bits which define the addressed node for which the data packet attached to the header packet is intended. Such message organization is commonly used in networking of computers, terminals and peripherals. FIG. 14A is a symbolic drawing of a typical message organization where CRCH 101 is a collection of CRC checkbits calculated on the header bits 100 and where CRCD 103 is a collection of CRC checkbits calculated on the data message 102.

Figure 14B:
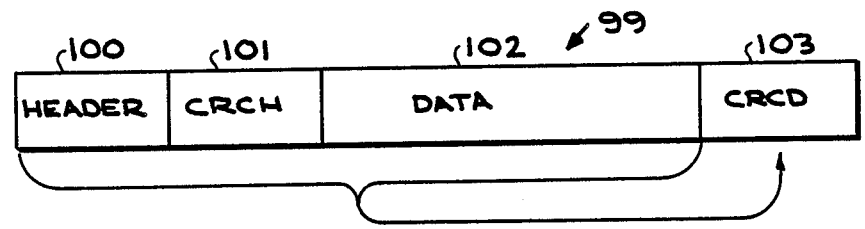

There are commonly used two different methods of calculating the CRCD checkbits. The first way is shown in FIG. 14A where the CRCD checkbits are calculated on the data message 102 alone. The second way is shown in FIG. 14B where the CRCD checkbits are calculated on the entire packet including the header 100, the CRCH checkbits 101 and the data bits 102. It is useful to have a CRC calculation machine which is capable of calculating separate CRCH and CRCD checkbit packets in either of the two ways.

Any of the embodiments described above or to be described below which have a gate in the feedback bus 36 or which have the hold bus such as the bus 91 from the output of the checksum register 30 to its input through an input multiplexer 86 can calculate separate CRCH and CRCD checkbit packets according to the method of FIG. 14A. This is done by stopping the CRC calculation after the header packet has been processed, outputting the then existing contents of the checksum register 30 as the CRCH packet and then presetting the checksum register and allowing the CRC calculation to begin again when the data message 102 begins to arrive.

Figure 15:
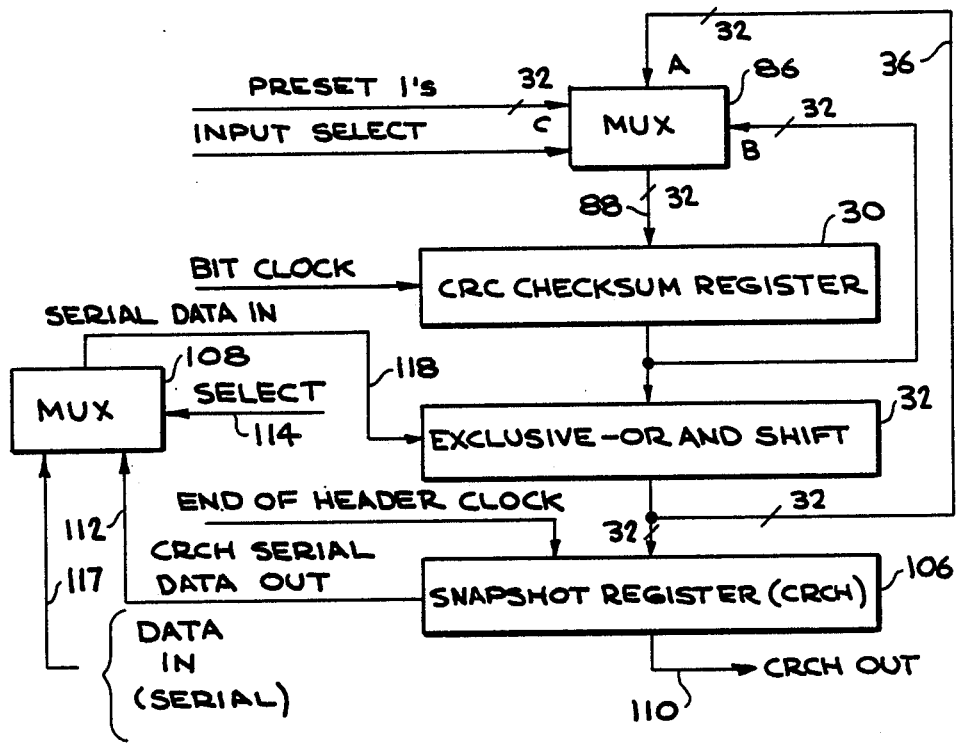
FIG. 15 illustrates one serial format input data embodiment for calculating the CRCH and CRCD checkbits according to either of the methods illustrated in FIG. 14.
Figure 16:
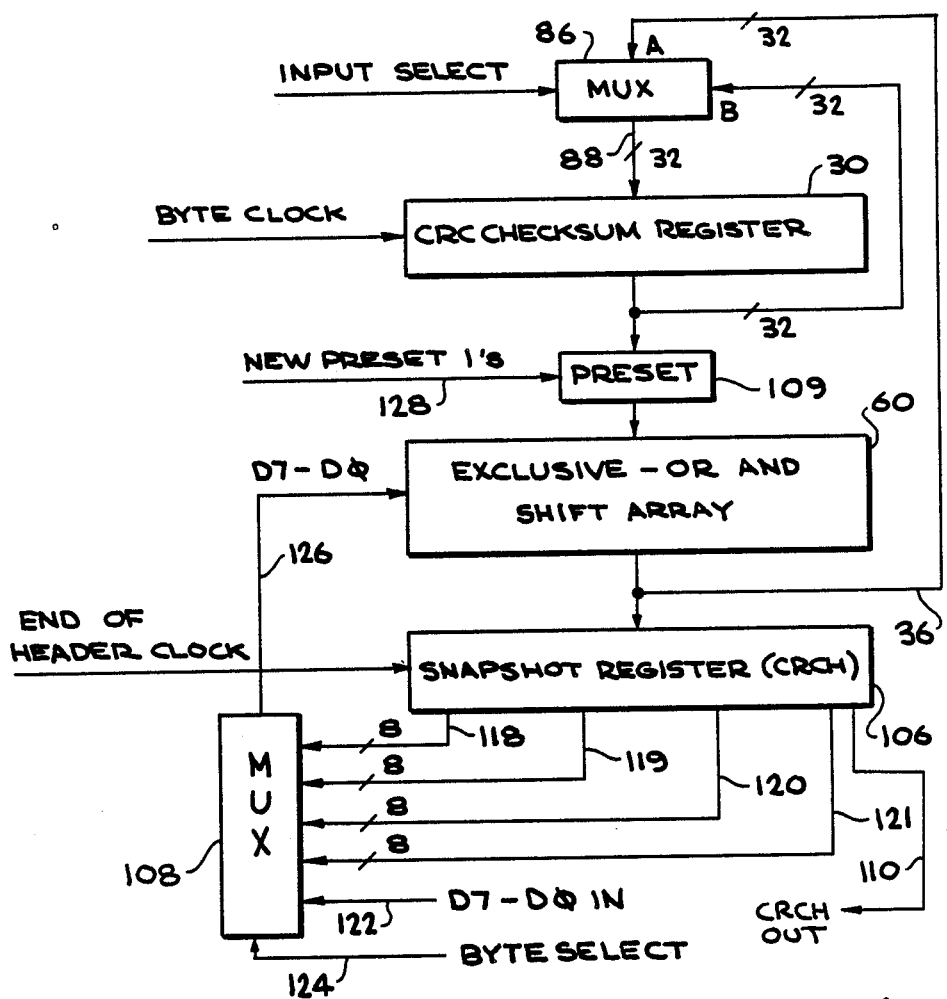
FIG. 16 illustrates one parallel format input data embodiment for calculating the CRCH and CRCD checkbits according to either of the methods illustrated in FIG. 14.

The embodiment of FIG. 15 is one embodiment of a CRC calculation machine which can compute separate CRCH and CRCD checkbit packets in accordance with the method of FIG. 14B using a serial format array 32 of shifting links. The embodiment of FIG. 16 is one embodiment of a CRC calculation machine which can compute separate CRCH and CRCD checkbit packets in accordance with the method of FIG. 14B using a parallel format array 32 of shifting links. Both of these embodiments use a separate snapshot register 106 and a multiplexer 108 to implement the method of FIG. 14B. The common portions of these embodiments will be described below without distinguishing between whether a serial or parallel array of shifting links is used since this is irrelevant to the operation of this aspect of the invention.

A checksum register 30 identical in construction, operation and purpose to the checksum registers described above in other embodiments has its data inputs coupled to the data outputs of an input multiplexer 86 by a 32 bit wide bus 88. The multiplexer 86 has three inputs which are the same inputs and which serve the same purpose of the inputs for the multiplexer 86 in FIG. 8 discussed above.

The output of the checksum register 30 is coupled to the input of the array of shifting links either directly as in FIG. 15 or through a preset means 109 as shown in FIG. 16. The embodiment of FIG. 15 uses the preset method where the logic 1's are loaded into the checksum register 30 during the clock cycle before the CRC calculation starts. This is done by asserting the INPUT SELECT signal so as to select the input C of the multiplexer 86 during the clock cycle before the start of the CRC calculation so as to load 32 logic 1's into the checksum register 30. The embodiment of FIG. 16 uses the preset method of forcing logic 1's into the input of the array of shifting links during the first clock cycle of the CRC calculation method as described above with respect to FIG. 9 through 12. The preset means 109 can be either OR gates like the OR gates 91 in FIGS. 9 and 10, or multiplexers like the multiplexers 94 through 97 shown in FIGS. 11 and 12. Either preset method and apparatus may be used on either of the embodiments of FIGS. 15 or 16.

The array of shifting links 32 or 60 can be any of the arrays of shifting links described herein. Regardless of whether the array 32 or 60 is for processing of serial format data messages or parallel format data messages, the outputs of the array are coupled to 32 data inputs of a snapshot register 106 which serves as a storage location for a copy of the CRCH checkbits. The snapshot register is comprised of a plurality of memory cells like those used in the checksum register, but those skilled in the art will appreciate other types of memory cells which may be used. The clock inputs of the memory cells in the snapshot register 106 are for coupling to an END OF HEADER clock signal which serves to load the output of the array of shifting links 32 or 60 into the snapshot register 106 after all the header bits have been processed and the output of the array on the bus 36 consists of the CRCH bits. These CRCH bits can be output on the CRCH output bus 110 byte by byte by use of a multiplexer such as the multiplexer 72 in FIG. 6 or in other methods which will be apparent to those skilled in the art.

To implement the CRCD calculation method of FIG. 14B, the CRCH bits must be fed back into the array of shifting links as raw input data so that CRC bits may calculated on the CRCH bits. This is the purpose of the multiplexer 108 and the circuitry connected to it. The structure of this circuitry will be described briefly here followed by a description of its operation in implementing the method of FIG. 14A and in implementing the method of FIG. 14B.

In the embodiment of FIG. 15, the snapshot register 106 is connected as a shift register so that the CRCH bits may be shifted into one input of the multiplexer 108 in serial fashion on a line 112. The other input of the multiplexer 108 is coupled to the source of the serial raw input data. A select signal on a line 114 causes the multiplexer 108 to couple either the raw data in the message on line 116 or the CRCH data on the line 112 into the raw data input 118 of the array 32.

A similar situation exists for the embodiment of FIG. 16 except that the snapshot register 106 has 4 one byte wide output buses 118 through 121 which are coupled to 4 input ports of a multiplexer 116. The parallel format input data bits D7 through D0 are coupled by a bus 122 to an input port of the multiplexer 116, and a BYTE SELECT signal on a line 124 controls which of the inputs of the multiplexer 116 are to be coupled to the raw data input 126 of the array of shifting links.

The embodiments of FIGS. 15 and 16 can be used to calculate the CRCD checkbits in the manner of FIG. 14A. First, a preset operation must be done. Specifically as to the FIG. 15 embodiment, by asserting the INPUT SELECT signal to select input C, 32 logic 1's will be loaded into the checksum register 30 in preparation for the CRC calculation. The FIG. 16 embodiment can perform the preset in the same manner if the input multiplexer 86 is modified in FIG. 16 to have the inputs of FIG. 15, and the preset operation will be performed in the same manner. Either of the FIG. 15 or FIG. 16 embodiments can be preset using the new preset means 109 by asserting the NEW PRESET signal on the line 126 in the manner previously described. Next, by asserting the INPUT SELECT signal to select the A input of the multiplexer 86, CRC calculation can begin. The input A will be selected during CRC calculation on the header bits 100.

After processing of the header bits, if the method of FIG. 14A is to be used to calculate the CRCD checkbits, the input B will be selected during the clock cycles when the CRCH bits are output from the checksum register 30. This output process for outputting CRCH can be by any of the methods described above for serial or parallel shifting arrays depending upon the type of output bus structure coupled to the snapshot register.

After the CRCH bits are output, the checksum register is preset to all 1's again if the method of FIG. 14A is to be performed. The raw input data of the data message 102 is then input to the array 32 or 60 and processed to calculate the CRCD checkbits.

If the method of FIG. 14B is to be performed, the presetting steps and calculation steps are the same as above for calculating CRCH. However, upon completion of calculation of the CRCH checkbits, they must be copied into the snapshot register 106 so that they may be output while simultaneously being fed back into the raw data input of the array of shifting links. To do this, the END OF HEADER signal is asserted, which causes the CRCH bits to be loaded into the snapshot register 106. The END OF HEADER clock signal can be the clock signal supplied to the checksum register, i.e., the BIT CLOCK signal, gated through a gate which only allow it to pass when the end of the header is detected. This causes a copy of the CRCH bits to be made in the snapshot register 106 and shifted out one bit at a time on the bus 112. Another copy of the CRCH bits will be input at the end of the header into the checksum register 30 via the bus 36. In the case of the embodiment of FIG. 15, the multiplexer 116 is caused by the SELECT signal on the line 114 to couple the serial data stream on the line 112 to the raw data input 118. Thus the CRCH checkbits are input to the array and operated upon in the fashion described previously. After all the CRCH checkbits have been processed, the multiplexer 108 is caused by the SELECT signal to switch its output 118 back to the data message bits 102 on the line 117. After all the data bits in the message 102 have been processed, the CRCD checkbits will reside in the checksum register 30 and can be output in any of the manners described above.

Figure 17:
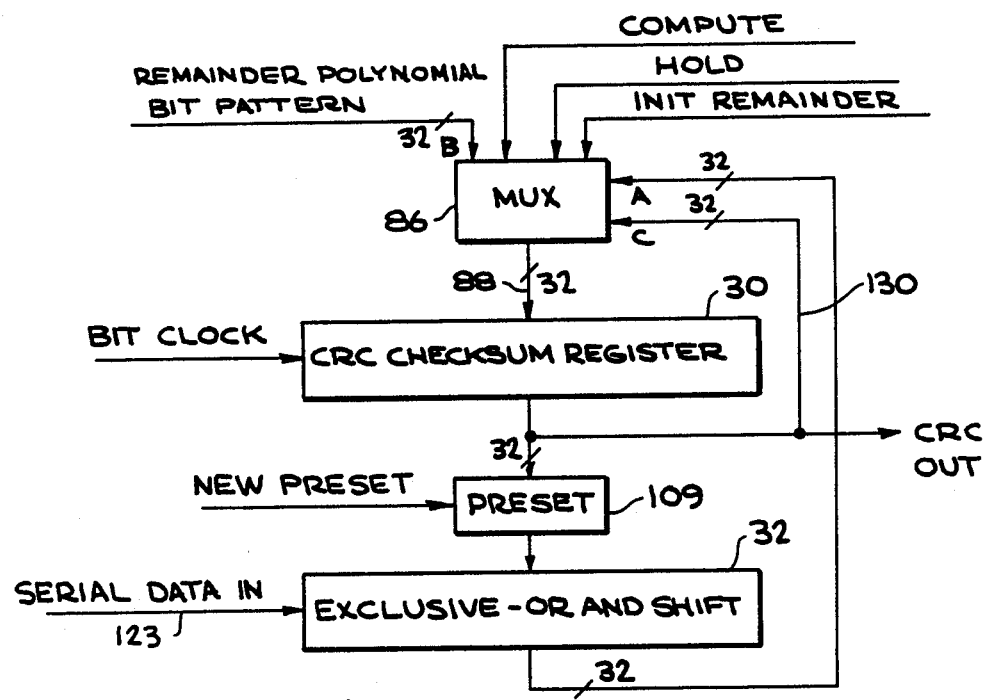
FIG. 17 illustrates the preferred serial format input data embodiment for calculating the CRCH and CRCD checkbits according to either of the methods illustrated in FIG. 14.
Figure 18:
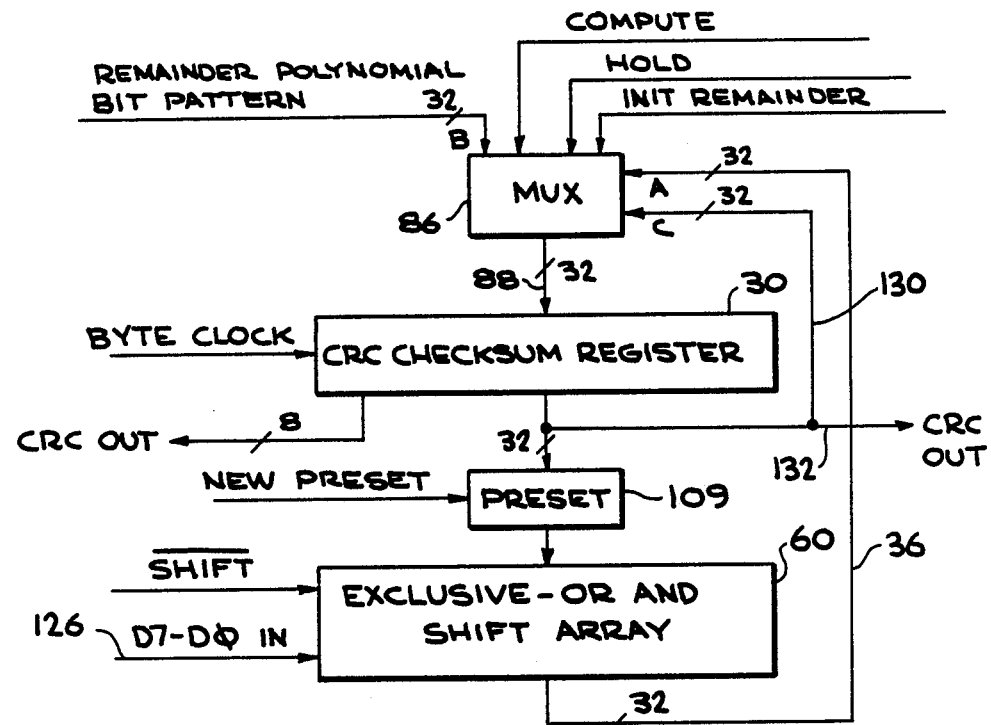
FIG. 18 illustrates the preferred parallel format input data embodiment for calculating the CRCH and CRCD checkbits according to either of the methods illustrated in FIG. 14.

The preferred embodiment for performing the CRCH and CRCD checkbit calculations is shown in FIG. 17 in serial array format and in FIG. 18 in parallel array format. Each embodiment uses an input multiplexer 86 having its data outputs coupled to the 32 data inputs of the checksum register 30 by a bus 88. Each multiplexer 36 has an A input coupled to the feedack bus 36 coupled to the output of the array of shifting links 32 or 60. Each multiplexer also has an input C coupled by a bus 130 to the data outputs of the checksum register 30. Finally, each multiplexer 86 has a B input coupled to a remainder polynomial bit pattern.

This bit pattern represents the coefficients of the standard remainder polynomial which results when CRC checkbits are calculated on a data message and its checkbits starting from a preset state of all logic 1's.

The arrays of shifting links can be any of the array structures described herein. The output of the array of shifting links is coupled to the input of the checksum register 30 through the input multiplexer 86 by the feedback bus 36. The input of the arrays 32 or 60 are coupled to the data outputs of the checksum register 30 through a preset means 109 which has the same structure, operation and purpose as the preset means previously described. The data outputs of the checksum regsiter 30 are also coupled to an output bus 132 which can have any of the structures and and be used in any of the manners described above to output CRC data from the checksum register.

Figure 19:
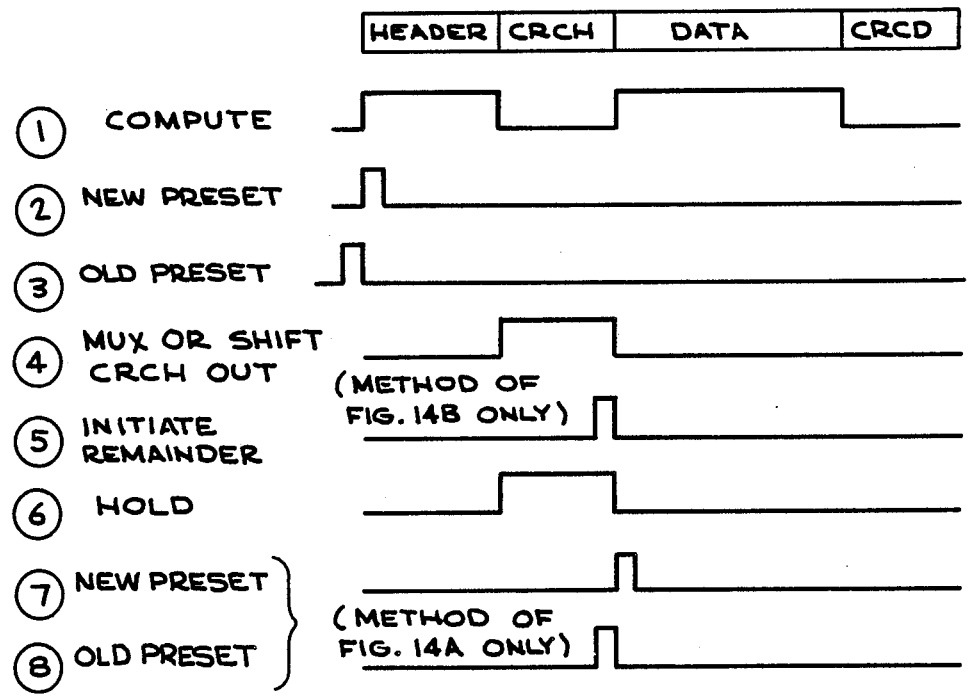
FIG. 19 illustrates the timing for the control signals which control the embodiments of FIGS. 17 and 18 in calculating the CRCD and CRCD checkbits according to methods illustrated in FIG. 14.

The manner in which the embodiments of FIGS. 17 and 18 work to calculate the CRCH checkbits and to calculate the CRCD checkbits is best understood by referring to the timing diagram of FIG. 19.

FIG. 14A Method

To calculate CRCH and CRCD in the manner of FIG. 14A, the arrays of shifting links in the embodiments of FIGS. 17 and 18 are preset to all logic 1's by asserting the NEW PRESET signal during the same clock cycle that the first bit or byte of the header packet arrives as shown on time line 2 of FIG. 19. In other embodiments which use the alternative types of preset apparatus, the input select signal OLD PRESET is asserted to select the input of the input multiplexer which is coupled to a source of 32 logic one's.

Next, the COMPUTE input select signal is asserted causing the input A to be selected and the CRCH checkbits are calculated on the header bits. After all bits of the header packet 100 have been processed, the CRCH checkbits will reside in the checksum register and may be shifted out on the CRC output bus in the case of the embodiment of FIG. 17 or may be output one byte at a time using the apparatus described earlier herein. This process is symbolized by the assertion of the signal MUX or SHIFT on time line 4 of FIG. 19. In alternative embodiments, all 32 bits of CRCH checkbits may be output in parallel. During the time when the CRCH bits are being output, the input multiplexer 86 is caused by the assertion of the HOLD signal illustrated on time line 6 to select input C for coupling to the checksum register input. This maintains the contents of the checksum register constant during the time the CRCH bits are being output to implement the method of FIG. 14A.

Upon completion of the output of the CRCH bits, the checksum register is again preset with all 1's by either asserting the NEW PRESET signal as shown on time line 7 of FIG. 19 or by asserting the OLD PRESET signal during the clock cycle before the data message starts as shown on time line 8 of FIG. 19. Thereafter, the input multiplexer is caused by assertion of the COMPUTE signal to again select the A input for coupling to the input of the checksum register 30. This causes the CRC calculation to resume on the raw input data bits of the data message 102 arriving at the raw data inputs 123 and 126. After all the data bits in the message 102 have been processed, the CRCD checkbits will be present in the checksum register 30. That concludes the method of calculation of the CRCH and CRCD checkbits per the method of FIG. 14A.

FIG. 14B Method

To calculate the CRCH and CRCD checkbits in accordance with the method of FIG. 14B, the embodiments of FIGS. 17 and 18 are operated as follows. The NEW PRESET signal is asserted during the first clock cycle of the header as before and as shown on time line 2 of FIG. 19. The COMPUTE input select signal is simultaneously asserted as shown on time line 1 of FIG. 19. This selects the input bus A of the input multiplexer for coupling to the input of the CRC checksum register. The CRCH calculation then proceeds as earlier described. The CRCH checkbits will be present in the checksum register after all the header bits have been processed.

As before, these CRCH checkbits must be held constant in the checksum register 30 while they are output. However, there is no snapshot register to hold a copy of them, so the input multiplexer 86 must be forced by assertion of the HOLD signal to select the input C so the CRCH bits in the checksum register 30 are recirculated without change until they have all been output. The outputting process for the CRCH bytes is identical to the process as described above and is symbolized by the signal assertion shown on the time line 4 of FIG. 19.

Several clock cycles will have passed during this process of outputting the CRCH bits without any CRCD checkbit calculation on the CRCH bits having been done. To implement the method of FIG. 14B, the CRCD checkbits must be calculated on the entire packet including the header 100, the CRCH bits 101 and the data packet 102. To accomplish this, the input multiplexer is forced to select the input B at the end of outputting of all the CRCH bits during the clock cycle just before the first clock cycle in the input of the data portion 102 of the message 99. This is done by the assertion of the INITIATE REMAINDER signal illustrated on time line 5 of FIG. 19. This loads the remainder polynomial bit pattern into the checksum register 30 at the very same time that that bit pattern would have existed in the checksum register anyway if calculation of CRCD data bits had been continuous since the first bit of the header. In other words, if the input C had not been selected at the end of the header to hold the CRCH bits in the checksum register constant during the output thereof, the bits which would have resulted in the checksum register by the time all the CRCH checkbit had been processed would be the bits in the remainder polynomial bit pattern. That this bit pattern can be accurately predicted is known since anytime a CRC calculation is performed on a data message plus the CRC bits calculated on the message alone, the resulting CRC bits represent a known polynomial which is published in the standard incorporated by reference herein defining the generator polynomial for the Autodin II and Ethernet standards.

No presetting is done before processing the bits in the data packet 102 in this method. After all the bits in the data packet 102 have been processed, the CRCD checkbits reside in the checksum register and can be output in any of the manners described herein.

Variable Bit Boundary CRC Calculation

It is common in computer networks to send multiple byte messages to other nodes on the network where the first few bits of the first byte are subject to being changed on the fly by various nodes in the system. This is especially common in token ring networks. Since these bits are subject to being changed on the fly, they must not be included in the CRC calculation lest they be falsely assumed to be errors.

One parallel format embodiment for calculating CRC checkbits on a variable number of bits in the first byte of the data message would be to make the first few rows of shifting links transparent. This would be done after presetting the checksum register to all logic 1's. The logic 1's are passed through to the first active row of shifting links coupled to the first bit of the raw input data to be included in the CRC calculation. However, the shifting action of the transparent rows of shifting links must be disabled to use this embodiment so that the least significant bits of the transparent rows are not filled with logic 0's as the logic 1's are shifted left in the transparent rows. This embodiment is more difficult to implement that the embodiment to be described next.

One important aspect of the invention is to provide a flexible means whereby one or more bits in the first byte of a message upon which calculation of CRC bits is desired may be ignored. The problem in a parallel format calculation using a byte clock where several initial bits are to be ignored is to preset the appropriate row of shifting links to all 1's. The appropriate row is the row which has as an input to its input gate (such as the gate 62 in FIGS. 7A and 7B) the first data bit in the raw input data of the first byte in the message which is to be included in the CRC calculation. FIG. 20 illustrates the apparatus to accomplish this function along with the apparatus implementing the other important functions of the invention.

Figure 20A:
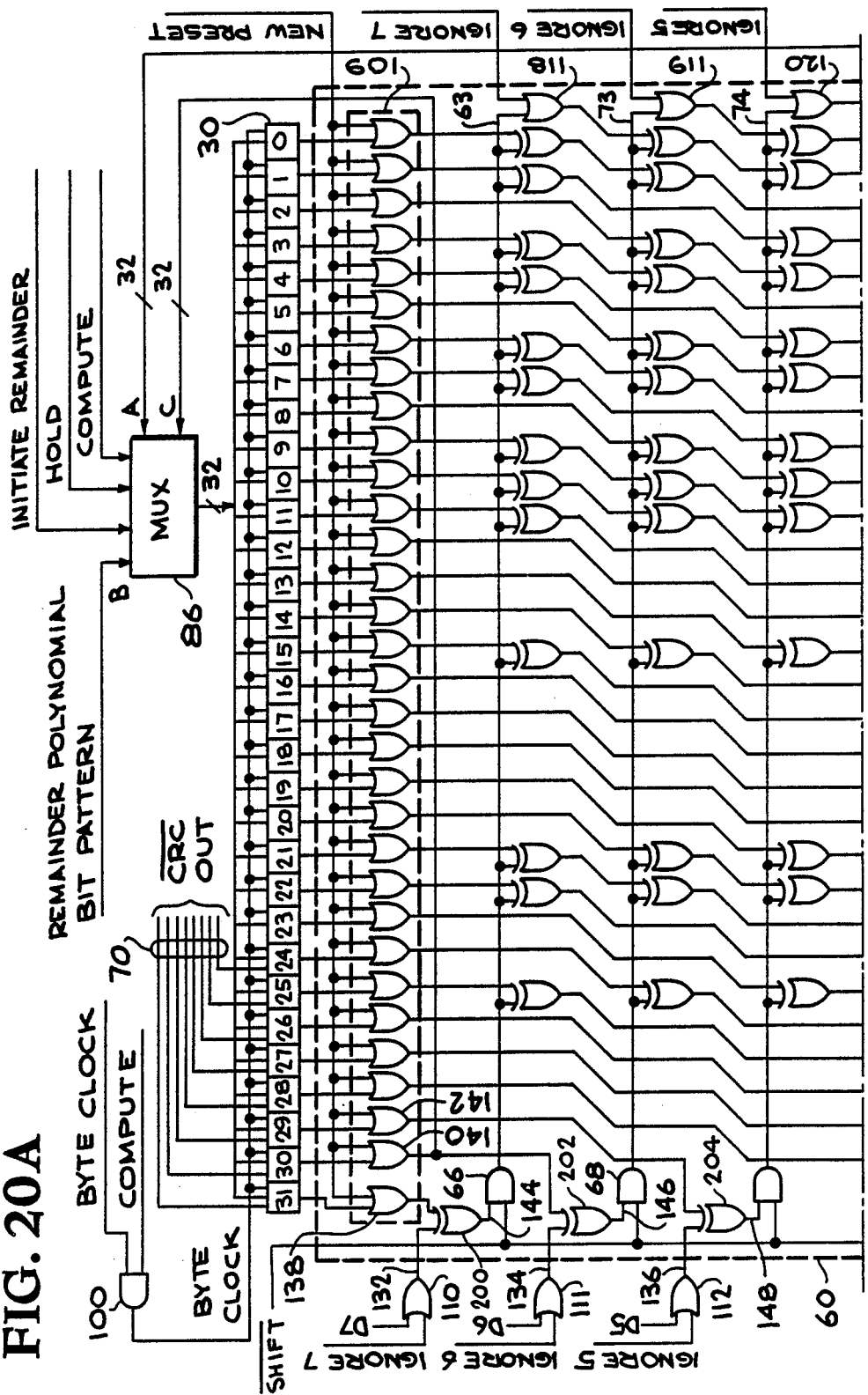
FIGS. 20A and 20B illustrates the variable bit boundary feature of the invention and including several other features of the invention.
Figure 20B:
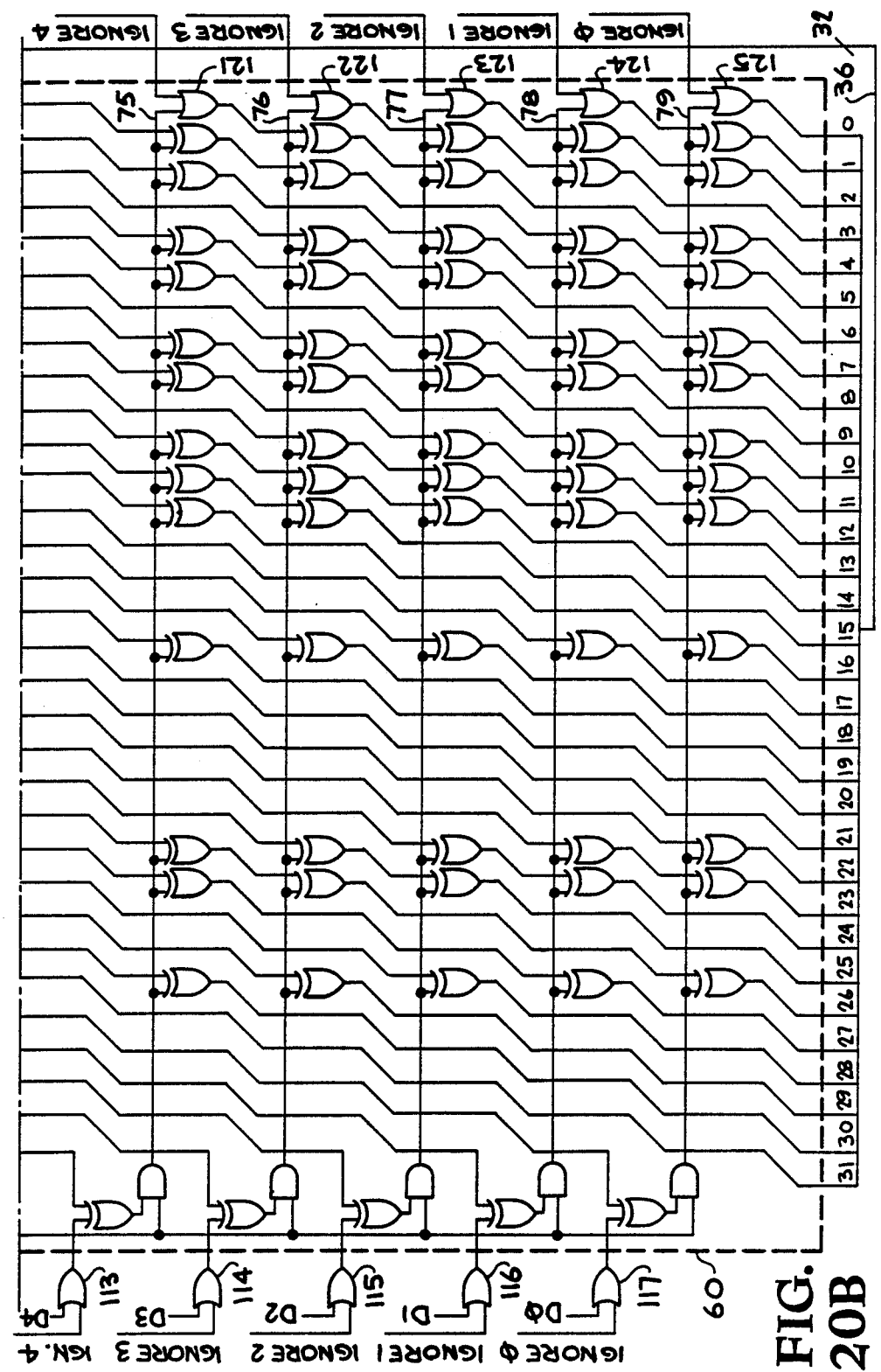

The variable bit boundary function is implemented by the OR gates 110 through 125. The manner in which these OR gates cause the rows of shifting links coupled to the bits to be ignored to become transparent is best illustrated by example. The reader should simultaneously refer to FIG. 21 which is a timing diagram of the control signals needed to implement the variable bit boundary function. The control signals needed to control the other apparatus illustrated in FIGS. 20A and 20B to perform the other functions of the invention which the embodiment of FIGS. 20A and 20B is capable of performing are as previously described herein.

To make the rows of exclusive-OR gates transparent so as to pass the preset logic 1's to the next row, a logic 0 must be applied to one of the inputs of these exclusive-OR gates in the affected rows, i.e., the rows coupled to the bits to be ignored. This is the function of the OR gates 110 through 117 and of the IGNORE signals coupled to each of these OR gates. Assume that the first three data bits D7 through D5 are to be ignored in the CRC calculation. The first clock cycle of the CRC calculation is arbitrarily assumed to be between the times $t_0$ and $t_1$ in FIG. 21. During the first clock cycle of the CRC calculation starting at the transition 131 of BYTE CLOCK signal illustrated on time line 1 of FIG. 21, the CALCULATE control signal for the input multiplexer 86 is asserted to select input A to allow the CRC calculation to begin as illustrated on time line 3. Also during the first clock cycle, the NEW PRESET signal is asserted to force all logic 1's into the data inputs of the first row of shifting links coupled to the input data bit D7 through the input gate 62 as illustrated on the time line 2. Also during the first clock cycle of the CRC calculation, but only during the first clock cycle, the IGNORE 7, IGNORE 6 and IGNORE 5 signals are asserted. Regardless of the logic state of the data bits D7, D6 and D5, logic 1's will exist on the lines 132, 134 and 136. The input gates 200, 202 and 204 thus receive two logic 1's at their inputs because the preset gates 138, 140 and 142 are forcing their outputs to logic 1's by virtue of the logic 1 state of the NEW PRESET signal. This is true regardless of the contents of the checksum register 30 at this time. The output lines of the exclusive-OR gates 200, 202 and 204 will be logic 0's therefore during the first clock cycle of the CRC calculation. The preset gates 109 are forcing all the data inputs of the first row of shifting links to which they are connected to a logic 1 state. These logic 1's are passed directly through to the second row by all the shifting links which are wires and are passed through all the shifting links which are exclusive-OR gates without inversion by virtue of the logic 0 on their common input line 63. This common input line carries the output signal from the input gate 200 after it is ANDed with the SHIFT* signal which is in a logic 1 state during the entire CRC calculation as shown on time line 4 of FIG. 21.

The common input line 63 of the first row also carries the input data bit for the least significant bit position shifting link of the second row. Since this bit must also be a logic 1 for the arrangement to work properly, another OR gate 118 is interposed between the common line 63 and the data input of the least significant bit position shifting link in the second row. This OR gate 118 has one input coupled to the common input line 63 and another input coupled to the line carrying the IGNORE 7 signal. The output of this OR gate is coupled to the input of the least significant bit position shifting link of the second row of shifting links. Since the IGNORE 7 signal is a logic 1 during the first clock cycle of the CRC calculation, a one will be forced into the input of the least significant bit position shifting link of the second row.

Each row of shifting links in the array has an OR gate like the gate 118. The outputs of all these OR gates, i.e., the gates 119 through 125 is coupled to the input of the least significant bit position shifting link in the next row and each gate has one input coupled to the IGNORE signal for that row and another input coupled to the common input line for that row. Thus any number of rows can have logic 1's forced into their least significant bit position shifting links by asserting the IGNORE signal for that row. Likewise, any number of rows can be made transparent by asserting the IGNORE signal coupled to the OR gates 110 through 117 having their outputs coupled to the inputs of the input gate for the row to be made transparent.

Figure 21:
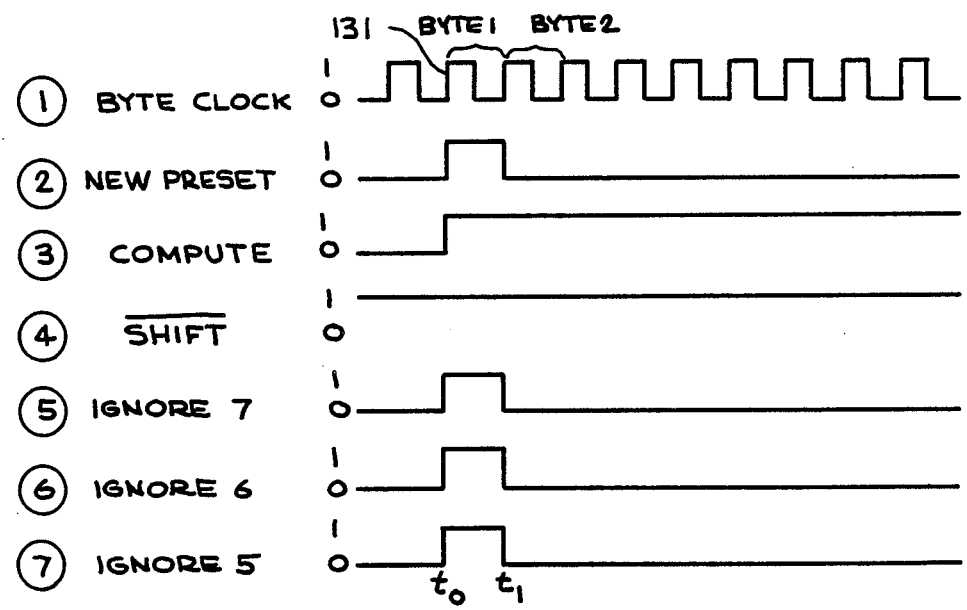
FIG. 21 is a timing diagram for the embodiment of FIGS. 20A and 20B illustrating the operation of the variable bit boundary function of the invention.

In the particular example at hand, the IGNORE 7 through IGNORE 5 signals are asserted during the first clock cycle of the CRC calculation as shown on time lines 5 through 7 of FIG. 21. This causes the first three rows of the array 60 to be transparent and to pass all logic 1's to the data inputs of the fourth row of shifting links. Thus during the first clock cycle of the CRC calculation, CRC checkbits will be calculated on all the bits of the first input byte D7 through D0 except the data bits D7 through D5. This occurs because the preset 1's are transmitted directly through the rows of shifting links coupled to the data bits D7 through D5 and so the row of shifting links coupled to data bit D4 acts like it is the first row in the array. After the first clock cycle of the CRC calculation is completed, the IGNORE 7 through IGNORE 5 signals are deactivated, and the CRC calculation proceeds normally.

Although the invention has been described in terms of a preferred embodiment, those skilled in the art may recognize modifications of substitutions which will work to practice the invention without departing from the spirit and scope of the invention. All such modifications and substitutions are intended to be included within the scope of the claims appended hereto.

What is claimed is:

1. An apparatus for computing CRC bits comprising:
   a CRC checksum register for storing a plurality of CRC bits and having a data input for receiving each CRC bit and having a data output for each stored CRC bit;
   a calculation means having a data outputs coupled to said data input of said CRC checksum register and having data inputs coupled to said data output of said CRC checksum register and having raw data input, said calculation means for accepting input data from said CRC checksum register and raw input data at said raw data input and for dividing said raw input data by a predetermined binary number and for storing the remainder of said division in said CRC checksum register as said CRC check bits;
   a snapshot register having an input for receiving an END OF HEADER clock signal, said snapshot register for storing said first plurality of CRC bits upon receipt of said END OF HEADER clock signal and having a plurality of inputs coupled to said data outputs of said calculation means and having a data output for said CRC bits;
   a multiplexer having a first input coupled to said data output of said snapshot register and having a second input for coupling to a source of raw input data and having a data output coupled to said raw data input of said calculation means and having a control input for receiving a control signal controlling which of said first or second inputs are to be coupled to said raw data input of said calculation means.

2. An apparatus as defined in claim 1 further comprising an input multiplexer having an output coupled to said data input of said CRC checksum register and having a first input coupled to said data output of said calculation means and having a second input coupled to said data output of said CRC checksum register and having a control input for receiving a signal controlling which of said first or second inputs is coupled to said data input of said CRC checksum register.

3. The apparatus of claim 2 further comprising preset means having inputs and having outputs, each said input coupled to a data output of said CRC checksum register, each said output coupled to a data input of said calculation means, said preset means, upon receipt of a NEW PRESET signal, for forcing a logic 1 to be received by each said data input of said calculation means.

4. The apparatus of claim 2 wherein said input multiplexer has a third input coupled to a source of a plurality of logic 1's, one said logic 1 for each said CRC bit and wherein said control signal controls whether said first, second or third input is coupled to said data input of said CRC checksum register.

5. The apparatus of claim 2 wherein said calculation means includes a plurality of rows of shifting links, each shifting link having an input and an output, and wherein said raw input data is in parallel format and said calculation means has one said row for each input data bit, and wherein each shifting link row has its inputs coupled to the outputs of the next least significant shifting links in the previous row except for the least significant shifting link in each row which has its input coupled to the output of the most significant shifting link in the preceding row and except for the first row which has its inputs coupled to said data outputs of said CRC checksum register as if it were a preceding row of shifting links, and wherein the last row of shifting links has its data outputs coupled to said data inputs of said CRC checksum register and wherein predetermined shifting links are gates which perform an exclusive-OR logical operation between their input bits and an predetermined signal.

6. An apparatus as defined in claim 5 wherein there is a predetermined signal for each said row of said shifting links and each said predetermined signal is generated by an input gate corresponding to that particular row which performs a predetermined logical operation between a predetermined one of said CRC bits and a data bit from said input data byte.

7. An apparatus as defined in claim 6 wherein the input gate corresponding to the first row is a gate which performs an exclusive-OR logical operation between the most significant CRC bit stored in said CRC checksum register and the first data bit which would arrive if the raw input data were input in serial fashion, and wherein the input gate corresponding to the second row is a gate which performs an exclusive-OR operation between the next most significant CRC bit stored in said CRC checksum register and the second bit which would arrive if said raw input data were input in a serial fashion and so on for each row of said shifting links.

8. The apparatus of claim 2 wherein said calculation means is comprised of a row of shifting links having inputs coupled to said outputs of said CRC checksum register and having outputs coupled to said data inputs of said CRC checksum register but shifted one bit position toward the most significant CRC bit, some of said shifting links being exclusive-OR gates having a first input coupled to a data output of said CRC checksum register, the most significant CRC bit data output of said CRC checksum register being coupled to one input of a data input exclusive-OR gate, said data input exclusive-OR gate having another input for coupling to a serial stream of input data and having its output coupled to a second input of each said exclusive-OR gate in said row of shifting likes.

9. The apparatus of claim 8 wherein said first and second data inputs are serial data inputs and wherein said output of said multiplexer is a serial data output and wherein said data output of said snapshot register is a serial data output.

10. The apparatus of claim 1 wherein said calculation means includes a plurality of rows of shifting links, each shifting link having an input and an output, and wherein said raw input data is in parallel format and said calculation means has one said row for each input data bit, and wherein each shifting link row has its inputs coupled to the outputs of the next least significant shifting links in the previous row except for the least significant shifting link in each row which has its input coupled to the output of the most significant shifting link in the preceding row and except for the first row which has its inputs coupled to said data outputs of said CRC checksum register as if it were a preceding row of shifting links, and wherein the last row of shifting links has its data outputs coupled to said data inputs of said CRC checksum register and wherein predetermined shifting links are gates which perform an exclusive-OR logical operation between their input bits and a predetermined signal.

11. An apparatus as defined in claim 10 wherein there is a predetermined signal for each said row of said shifting links and each said predetermined signal is generated by an input gate corresponding to that particular row which performs a predetermined logical operation between a predetermined one of said CRC bits and a data bit from said input data byte.

12. An apparatus as defined in claim 11 wherein the input gate corresponding to the first row is a gate which performs an exclusive-OR logical operation between the most significant CRC bit stored in said CRC checksum register and the first data bit which would arrive if the raw input data were input in serial fashion, and wherein the input gate corresponding to the second row is a gate which performs an exclusive-OR operation between the next most significant CRC bit stored in said CRC checksum register and the second bit which would arrive if said raw input data were input in a serial fashion and so on for each row of said shifting links.

13. The apparatus of claim 10 wherein said snapshot register has a plurality of outputs, each said output coupled to one byte of CRC data stored in said snapshot register and each said output coupled to a separate input bus of said multiplexer and wherein said control input is coupled to means in said multiplexer to cause selection of any one of said inputs of said multiplexer for coupling to said raw data input of said calculation means.

14. The apparatus of claim 1 wherein said calculation means is comprised of a row of shifting links having inputs coupled to said outputs of said CRC checksum register and having outputs coupled to said data inputs of said CRC checksum register but shifted one bit position toward the most significant CRC bit, some of said shifting links being exclusive-OR gates having a first input coupled to a data output of said CRC checksum register, the most significant CRC bit data output of said CRC checksum register being coupled to one input of a data input exclusive-OR gate, said data input exclusive-OR gate having another input for coupling to a serial stream of input data and having its output coupled to a second input of each said exclusive-OR gate in said row of shifting links.

15. The apparatus of claim 14 wherein said first and second data inputs are serial data inputs and wherein said output of said multiplexer is a serial data output and wherein said data output of said snapshot register is a serial data output.

16. An apparatus for calculating a first plurality of CRC bits on a header packet and a second plurality of CRC bits comprising:
CRC checksum register means for storing a plurality of bits of data present at a plurality of inputs upon receipt of a byte clock signal at a byte clock input and for presenting the stored data at a plurality of data outputs;
second means for receiving the data at said data outputs and for passing it through to a plurality of data outputs except when a NEW PRESET signal is in a predetermined logic state, at which time said data outputs are forced to a logic one state;
calculation means for receiving data bits from said second means and raw input data bits at a raw data input and shifting predetermined bits in a predetermined fashion while performing an exclusive-OR operation between predetermined bits during predetermined shifts with predetermined signals and presenting the results at a plurality of data outputs coupled to the data inputs of said CRC checksum register means;
a snapshot register having a clock input for receiving and END OF HEADER clock signal, and having a plurality of inputs coupled to said data outputs of said calculation means and having a data output, said snapshot register for storing said first plurality of CRC bits upon receipt of said END OF HEADER clock signal;
a multiplexer having a first input coupled to said data output of said snapshot register and having a second input for coupling to a source of raw input data and having a data output coupled to said raw data input of said calculation means and having a control input for receiving a signal controlling which of said first or second inputs are to be coupled to said raw data input of said calculation means said calculation means for calculating said second plurality of CRC bits;
an input multiplexer having an output coupled to said data input of said CRC checksum register means and having a first input coupled to said data output of said calculation means and having a second input coupled to said data output of said CRC checksum register means and having a control input for receiving a signal controlling which of said first or second inputs is coupled to said data input of said CRC checksum register means.

17. An apparatus for computing a plurality of CRC bits comprising:
a CRC checksum register for storing a plurality of CRC bits and having a data input for receiving each CRC bit and having a data output for each stored CRC bit and having a clock input for receiving a clock signal;
calculation means having data inputs coupled to said data outputs of said CRC checksum register and having a raw data input and having data outputs, said calculation means for accepting raw input data at said raw data input upon which a CRC calculation is to be performed and for dividing it by a predetermined binary number and for storing the remainder of said division in said CRC checksum register as said CRC bits; and
an input multiplexer having a first input coupled to said data outputs of said calculation means and having a second input coupled to a predetermined bit pattern and having a data output coupled to said data inputs of said CRC checksum register and having a control input for receiving a control signal for indicating which of said first or second inputs is to be coupled to said multiplexer data output.

18. The apparatus of claim 17 wherein said predetermined bit pattern represents a standard remainder binary number representing a polynomial which results when CRC bits are calculated on a block of data plus the CRC bits which were previously calculated on said block of data.

19. An apparatus as defined in claim 18 further comprising preset means having inputs and having outputs, each said input coupled to a data output of said CRC checksum register, each said output coupled to a data input of said calculation means said preset means, upon receipt of a NEW PRESET signal, for forcing a logic 1 to be received by each said data input of said calculation means.

20. An apparatus as defined in claim 19 further comprising a CRC ouput bus coupled to the data outputs of only the most significant byte of CRC bits in said CRC checksum register.

21. The apparatus of claim 20 wherein said calculation means includes a plurality of rows of shifting links, each shifting link having an input and an output, and wherein said raw input data is a plurality of data bits in parallel format and said calculation means has one said row for each input data bit, and wherein each shifting link row has its inputs coupled to the outputs of the next least significant shifting links in the previous row except for the least significant shifting link in each row which has its input coupled to the output of the most significant shifting link in the preceding row and except for the first row which has its inputs coupled to said data outputs of said CRC checksum register as if it were a preceding row of shifting links, and wherein the last row of shifting links has its data outputs coupled to said data inputs of said CRC checksum register and wherein predetermined shifting links are gates which perform an exclusive-OR logical operation between their input bits and a predetermined signal.

22. An apparatus as defined in claim 21 wherein there is a predetermined signal for each said row of said shifting links and each said predetermined signal is generated by an input gate corresponding to that particular row which performs a predetermined logical operation between a predetermined one of said CRC bits and a data bit from said input data byte.

23. An apparatus as defined in claim 22 wherein the input gate corresponding to the first row is a gate which performs an exclusive-OR logical operation between the most significant CRC bit stored in said CRC checksum register and the first data bit which would arrive if the raw input data were input in serial fashion, and wherein the input gate corresponding to the second row is a gate which performs an exclusive-OR operation between the next most significant CRC bit stored in said CRC checksum register and the second bit which would arrive if said raw input data were input in a serial fashion and so on for each row of said shifting links.

24. An apparatus as defined in claim 23 wherein said CRC checksum register clock input is for receiving a byte clock signal and further comprising shifting means coupled to said CRC checksum register for outputting said bytes of CRC data on said CRC output bus one byte at a time by shifting said CRC bytes one byte at a time in syncrhonization with said byte clock signal into the highest order byte position of said CRC checksum register.

25. The apparatus of claim 24 wherein said shifting means is a plurality of AND gates, one for each row of said shifting links, each AND gate having one input coupled to the output of the input gate for a particular row and having its output coupled to one of the inputs of the exclusive-OR gates in the particular corresponding row of shifting links and each AND gate having another input for coupling to a source of a SHIFT not sigal indicating when no CRC calculation is to be performed and only a shift of said CRC bits in said CRC checksum register is to be performed, said shift being by one byte toward the most significant byte in said CRC checksum register.

26. The apparatus of claim 20 wherein said calculation means is comprised of a row of shifting links having inputs coupled to said outputs of said CRC checksum register and having outputs coupled to said data inputs of said CRC checksum register but shifted one bit position toward the most significant CRC bit, some of said shifting links being exclusive-OR gates having a first input coupled to a data output of said CRC checksum register, the most significant CRC bit data output of said CRC checksum register being coupled to one input of a data input exclusive-OR gate, said data input exclusive-OR gate having another input for coupling to a serial stream of said raw input data and having its output coupled to a second input of each said exclusive-OR gate in said row of shifting links.

27. The apparatus of claim 18 wherein said calculation means includes a plurality of rows of shifting links, each shifting link having an input and an output, and wherein said raw input data is a plurality of data bits in parallel format and said calculation means has one said row for each input data bit, and wherein each shifting link row has its inputs coupled to the outputs of the next least significant shifting links in the previous row except for the least significant shifting link in each row which has its input coupled to the output of the most significant shifting link in the preceding row and except for the first row which has its inputs coupled to said data outputs of said CRC checksum register as if it were a preceding row of shifting links, and wherein the last row of shifting links has its data outputs coupled to said data inputs of said CRC checksum register and wherein predetermined shifting links are gates which perform an exclusive-OR logical operation between their input bits and a predetermined signal.

28. An apparatus as defined in claim 27 wherein there is a predetermined signal for each said row of said shifting links and each said predetermined signal is generated by an input gate corresponding to that particular row which performs a predetermined logical operation between a predetermined one of said CRC bits and a data bit from said input data byte.

29. An apparatus as defined in claim 28 wherein the input gate corresponding to the first row is a gate which performs an exclusive-OR logical operation between the most significant CRC bit stored in said CRC checksum register and the first data bit which would arrive if the raw input data were input in serial fashion, and wherein the input gate corresonding to the second row is a gate which performs an exclusive-OR operation between the next most significant CRC bit stored in said CRC checksum register and the second bit which would arrive if said raw input data were input in a serial fashion and so on for each row of said shifting links.

30. An apparatus as defined in claim 29 wherein said CRC checksum register clock input is for receiving a byte clock signal and further comprising shifting means coupled to said CRC checksum register for outputting said bytes of CRC data on said CRC output bus one byte at a time by shifting said CRC bytes one byte at a time in synchronization with said byte clock signal into the highest order byte position of said CRC checksum register.

31. The apparatus of claim 30 wherein said shifting means is a plurality of AND gates, one for each row of said shifting links, each AND gate having one input coupled to the output of the input gate for a particular row and having its output coupled to one of the inputs of the exclusive-OR gates in the particular corresponding row of shifting links and each AND gate having another input for coupling to a source of a SHIFT not signal indicating when no CRC calculation is to be performed and only a shift of said CRC bits in said CRC checksum register is to be performed, said shift being by one byte toward the most significant byte in said CRC checksum register.

32. The apparatus of claim 18 wherein said calculation means is comprised of a row of shifting links having inputs coupled to said outputs of said CRC checksum register and having outputs coupled to said data inputs of said CRC checksum register but shifted on bit position toward the most significant CRC bit, some of said shifting links being exclusive-OR gates having a first input coupled to a data output of said CRC checksum register, the most significant CRC bit data output of said CRC checksum register being coupled to one input of a data input exclusive-OR gate, said data input exclusive-OR gate having another input for coupling to a serial stream of said raw input data and having its output coupled to a second input of each said exclusive-OR gate in said row of shifting links.

33. For a packet of data comprised of a header packet and a data packet, a method of calculating CRC bits separately on the header packet and on the data packet plus the CRC bits calculated on the header packet comprising the steps of:
calculating the CRC bits on the header packet as input data bits using a checksum register and an array of shifting links for receiving said input data bits and bits from said checksum register where some of said shifting links are exclusive-OR gates to shift the bits in said checksum register and perform exclusive-OR operations between predetermined bits and said input data bits on predetermined shifts with predetermined signals;
outputting the CRC bits so calculated after all the bits in said header packet have been processed;
forcing the bits stored in said checksum register to assume the bit pattern of the standard remainder polynomial which results when CRC bits are calculated on a data packet plus the CRC bits calculated on that data packet;
continuing the CRC bit calculation on said data packet starting from the bits in said checksum register; and
outputting the CRC bits so calculated after all the bits of said data packet have been processed.

34. For a packet of data comprised of a header packet and a data packet, a method of calculating CRC bits separately on the header packet and on the data packet plus the CRC bits calculated on the header packet comprising the steps of:
calculating the CRC bits on the header packet as input data bits using a checksum register and an array of shifting links for receiving said input data bits and bits from said checksum register where some of said shifting links are exclusive-OR gates to shift the bits in said checksum register and perform exclusive-OR operations between predetermined bits and said input data bits on predetermined shifts with predetermined signals;
copying the CRC bits so calculated after all the bits of said header packet have been processed into a snapshot register;
outputting the CRC bits stored in said snapshot register;
inputting the CRC bits stored in said snapshot register into the calculation apparatus used to calculate said CRC bits as if they were said input data bits;
continuing said calculation step using the bits stored in said checksum register and said CRC bits stored in said snapshot register until all the CRC bits stored in said snapshot register have been processed;
after all said CRC bits in said snapshot register have been processed switching said input data to said array of shifting links so as to receive the data bits in said data packet;
continuing the calculation step until all the bits in said data packet have been processed; and
outputting the CRC bits so calculated after all the bits in said data packet have been processed.

35. For a packet of data comprised of a header packet and a data packet, a method of calculating CRC bits separately on the header packet and on the data packet comprising the steps of:
calculating the CRC bits on the header packet as input data bits using a checksum register and an array of shifting links for receiving said input data bits and bits from said checksum register where some of said shifting links are exclusive-OR gates to shift the bits in said checksum register and perform exclusive-OR operations between predetermined bits and said input data bits on predetermined shifts with predetermined signals;
outputting the CRC bits so calculated after all the bits in said header packet have been processed;
disabling the calculation of new CRC bits while said CRC bits calculated on said header packet are output;
re-enabling the calculation of CRC bits after all header CRC bits have been output and calculating the CRC bits on the bits of said data packet; and
outputting said CRC bits so calculated after all the bits of said data packet have been processed.

* * * * *